(12) United States Patent
Watanabe et al.

(10) Patent No.: US 9,971,238 B2
(45) Date of Patent: May 15, 2018

(54) MASK BLANK, PHASE SHIFT MASK, AND PRODUCTION METHOD THEREOF

(71) Applicant: DAI NIPPON PRINTING CO., LTD., Tokyo-to (JP)

(72) Inventors: Hiroshi Watanabe, Tokyo-to (JP); Katsuya Hayano, Tokyo-to (JP); Hideyoshi Takamizawa, Tokyo-to (JP); Youhei Ohkawa, Tokyo-to (JP); Takashi Adachi, Tokyo-to (JP); Ayako Tani, Tokyo-to (JP); Yoichi Miura, Tokyo-to (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 60 days.

(21) Appl. No.: 15/301,900

(22) PCT Filed: Jan. 29, 2015

(86) PCT No.: PCT/JP2015/052495
§ 371 (c)(1),
(2) Date: Oct. 4, 2016

(87) PCT Pub. No.: WO2015/156016
PCT Pub. Date: Oct. 15, 2015

(65) Prior Publication Data
US 2017/0123305 A1    May 4, 2017

(30) Foreign Application Priority Data
Apr. 8, 2014    (JP) ................. 2014-079690

(51) Int. Cl.
G03F 1/32    (2012.01)
G03F 1/54    (2012.01)

(52) U.S. Cl.
CPC . G03F 1/32 (2013.01); G03F 1/54 (2013.01)

(58) Field of Classification Search
CPC ..................... G03F 1/32; G03F 1/54

USPC ............................................ 430/5
See application file for complete search history.

(56) References Cited

U.S. PATENT DOCUMENTS

2007/0212619 A1    9/2007 Yoshikawa et al.
2010/0261099 A1*  10/2010 Yoshikawa ............ C23F 4/00
                                                    430/5

FOREIGN PATENT DOCUMENTS

| JP | 8-292550 | | 11/1996 | |
| JP | 11-026355 | * | 1/1999 | ............... G03F 1/32 |
| JP | 2002-251000 | * | 9/2002 | ............... G03F 1/32 |
| JP | 2007-241060 | | 9/2007 | |
| JP | 2007-241137 | | 9/2007 | |
| JP | 2012-003287 | * | 1/2012 | ............... G03F 1/32 |

* cited by examiner

Primary Examiner — Christopher G Young
(74) Attorney, Agent, or Firm — Hamre, Schumann, Mueller & Larson, P.C.

(57) ABSTRACT

The present invention provides a mask blank including: a transparent substrate, a half-transparent layer for controlling a phase and a transmittance of the exposure light, formed on the transparent substrate, a middle layer formed on the half-transparent layer, and a light-shielding layer formed on the middle layer, wherein the light-shielding layer is constituted with a single metal material not including a transition metal; a film thickness of the light-shielding layer is 40 nm or less; and an optical density of a laminated body, in which three kinds of layers: the half-transparent layer, the middle layer, and the light-shielding layer are laminated, with respect to the exposure light is a value to the extent that the laminated body functions as a light-shielding region or more; the mask blank is used for producing a half tone type phase shift mask, and suitable for a lithography technique on a wafer from 40 nm half pitch and on for its high light-shielding property even thinning the light-shielding pattern film, capability of decreasing the value of EMF bias, and excellency in pattern processability, light-shielding property and chemical resistance.

19 Claims, 6 Drawing Sheets

MASK BLANK, PHASE SHIFT MASK, AND PRODUCTION METHOD THEREOF

TECHNICAL FIELD

The present invention relates to a mask blank to be used for producing a semiconductor element, a phase shift mask and a producing method for the phase shift mask; in specific, relates to a half tone type phase shift mask to be used for a lithography technique, of which a half-pitch of a pattern on a wafer is from 40 nm on, when transferring a mask pattern on the wafer by using a high NA light exposing apparatus.

BACKGROUND ART

High integration and refinement of a semiconductor element has been improved from a design rule 45 nm node to 32 nm node; further, the development of a semiconductor element with the node of 22 nm or less has been in progress. In order to achieve these high integration and refinement of a semiconductor element, presently used technique is a photolithography technique for transferring a pattern on a wafer by using a photo mask by means of an optical projection exposing apparatus utilizing an ArF excimer laser with the light exposure wavelength of 193 nm. In the photolithography technique, rapid development and practical application of techniques for high resolution by using a light exposing apparatus, such as a high NA light exposing technique in which the numerical aperture (NA) of a projection lens is increased, a liquid immersion light exposing technique in which the light is exposed to a target via a high-refractive medium disposed between the projection lens and the target, and a modified-light installed light exposing technique have been rapidly are under way.

Under such circumstances, a super resolution technique (RET technique: Resolution Enhancement Technique) has been suggested in recent years, in order to improve the resolution level. Examples of such super resolution technique may include a method such that a mask pattern is optimized by applying an auxiliary pattern and bias (correcting amount of a mask line width, for example) to the mask pattern in accordance with the light exposing optical property, and a method called a modified lighting method (also called as an oblique light incidence lighting method). Lightings such as a zonal ray lighting using a pupil filter, a dipole lighting using a dipole pupil filter, and a quadrupole (C-quad) lighting using a quadrupole pupil filer are usually used for the modified lighting method.

On the other hand, as a measure for improving the resolution level in a photo mask (also called as a reticle) used for a photolithography technique, refinement and improvement in accuracy of a conventional binary type photo mask (hereinafter referred as binary mask) in which a pattern is designed in the portion of transmitting light and portion of shielding light by forming a light-shielding film using chrome for example on a transparent substrate; and development and practical application of phase shift masks such as a Levenson type phase shift mask for enhancing the resolution level improvement by means of the phase shift effect utilizing interference of light, a half tone type phase shift mask comprised of a light transmitting portion and half-transmitting portion, and a chrome-less type phase shift mask in which a light-shielding layer such as chrome is not arranged, have been in progress.

The above-described half tone type phase shift mask has a mask pattern comprised of a half-transparent film (hereinafter also referred to as a half-transparent pattern film) on a transparent substrate as a typical constitution, and is designed in the manner that the phase of exposure light transmitted to this half-transparent pattern film and the phase of exposure light transmitted to the transparent substrate are reversed.

In such half tone type phase shift mask, decrease in optical strength due to the phase reversing occurs at the border between the half-transparent pattern film arranged portion (hereinafter also referred to as a mask pattern portion) and a transparent substrate exposed portion, so as to prevent the optical strength distribution from being spread. In terms of a material for the half-transparent film, a compound of molybdenum silicide (MoSi), such as molybdenum silicide oxide nitride (MoSiON), is widely used.

Here, a transmittance of the half-transparent pattern film is conventionally designed to be approximately 6%, but the problem is that a transferred image becomes unclear due to the exposure light transmitted to this half-transparent pattern film, in the place where an area of the mask pattern portion is large. Under such circumstances, a constitution of shielding unnecessary exposure light certainly by arranging a light-shielding portion (hereinafter also referred to as a light-shielding pattern film) on a half-transparent pattern film has been suggested. (Refer to Cited Document 1 for an example.) A half tone type phase shift mask with such constitution is called as a try tone mask.

Here, a light-shielding pattern film of a try tone mask with high transmittance rate in a half-transparent film suitably used for forming a minute dot pattern and hole pattern requires thickness since higher light-shielding property is necessary for the light-shielding pattern film on the half-transparent pattern film.

However, if the light-shielding pattern film is thickened, a resist pattern for processing the light-shielding pattern film is also required to be thickened, which makes the processing of a fine pattern difficult. Also, a malfunction such as a pattern collapse during washing may be caused since the heights of the light-shielding pattern film and half-transparent pattern film are increased in the step of processing a mask.

Also, with regard to a binary mask to be used for a half-pitch (hp) of a pattern on a wafer from 40 nm on, the width of a mask pattern line on a photomask becomes smaller than the wavelength 193 nm of ArF excimer laser exposure light to be used for a lithography; a problem is that a value of bias (EMF bias) which is a correcting amount of a mask line width derived from the effect of an electro magnetics field (EMF) increases when the film thickness of a light-shielding pattern film in a mask pattern region is thick, since an oblique light incidence lighting method and a super resolution technique using a pupil filter have been adopted in order to form a fine pattern.

Then, such a problem arises also in a half tone type phase shift mask (try tone mask) having the above described light shielding pattern film.

Under such circumstances, with regard to the above described problem caused by the effect of an electro magnetics filed (EMF), a material for a mask has been reconsidered also in a half tone type phase shift mask (try tone mask) having the above described light shielding pattern film, and a try tone mask using a molybdenum silicide (MoSi) based material as a light-shielding pattern film material other than a chrome based material has been suggested in recent years (for example, refer to Patent Document 2).

CITATION LIST

Patent Documents

Patent Document 1: Japanese Patent Application Laid-Open No. (JP-A) 08-292550
Patent Document 2: JP-A 2007-241137

SUMMARY OF INVENTION

Technical Problem

However, a light-shielding pattern film comprising a material such as the above-described molybdenum silicide (MoSi) based material, in which the composition is adjusted in accordance with the demand for thinning the film, does not have sufficient chemical resistance during washing the mask or light resistance to an ArF excimer laser light exposure; a problem is that the qualities such as optical density cannot be stably maintained by a try tone mask using the above-described molybdenum silicide (MoSi) based material for the light-shielding pattern film.

Accordingly, the present invention has been made in view of the problem; a light-shielding pattern film is thinned and sufficient light-shielding property is maintained so as to allow a resist layer to be thin, and to improve resistance with respect to washing, so that a fine pattern can be produced even when using a half-transparent pattern film with high transmittance; in addition, a value of EMF bias can be decreased; and thus the present invention can provide a mask blank with excellent pattern processability, light and chemical resistance to be used for producing a half tone type phase shift mask suitable for lithography technique of half pitch on a wafer from 40 nm on, a phase shift mask, and a producing method thereof.

Solution to Problem

In order to solve the problem, a mask blank with regard to the invention in claim 1 of the present invention is a mask blank to be used for producing a half tone type phase shift mask which applies an ArF excimer laser exposure light, comprising: a transparent substrate; a half-transparent layer for controlling a phase and a transmittance of the exposure light, formed on the transparent substrate; a middle layer formed on the half-transparent layer; and a light-shielding layer formed on the middle layer, wherein the light-shielding layer is comprised of a single metal material not including a transition metal; a film thickness of the light-shielding layer is 40 nm or less; and an optical density of a laminated body, in which three kinds of layers: the half-transparent layer, the middle layer, and the light-shielding layer are laminated, with respect to the exposure light is a value to the extent that the laminated body functions as a light-shielding region or more.

The mask blank with regard to the invention in claim 2 of the present invention is the mask blank according to claim 1, wherein the laminated body, in which three kinds of layers: the half-transparent layer, the middle layer, and the light-shielding layer are laminated, is adjusted so as to have an optical density with respect to the exposure light being 2.8 or more.

The mask blank with regard to the invention in claim 3 of the present invention is the mask blank according to claim 1 or 2, wherein a relation between a transmittance T with respect to the exposure light of the half-transparent layer and a film thickness "d" of the light-shielding layer is: in the range of 23 nm≤d≤27 nm when T=6%; in the range of 31 nm≤d≤35 nm when T=20%; in the range of 33 nm≤d≤37 nm when T=30%.

The mask blank with regard to the invention in claim 4 of the present invention is the mask blank according to any one of claims 1 to 3, wherein the light-shielding layer is comprised of the single metal material with a refractive index "n" being 1.0 or less and an extinction coefficient "k" being 2.0 or more.

The mask blank with regard to the invention in claim 5 of the present invention is the mask blank according to any one of claims 1 to 4, wherein the single metal material is silicone.

The mask blank with regard to the invention in claim 6 of the present invention is the mask blank according to any one of claims 1 to 5, wherein the half-transparent layer is comprised of $Si_xO_{1-x-y}N_y$ ("x" and "y" satisfy $0<x<1$, $0<y<1$, and $0<x+y\leq1$).

The mask blank with regard to the invention in claim 7 of the present invention is the mask blank according to any one of claims 1 to 6, wherein the middle layer is comprised of a material with resistance to a dry etching using fluorine-based gas.

The mask blank with regard to the invention in claim 8 of the present invention is the mask blank according to any one of claims 1 to 7, wherein the middle layer is comprised of a chrome-based material containing chrome (Cr), and a film thickness of the middle layer is in the range of 2 nm to 5 nm.

The mask blank with regard to the invention in claim 9 of the present invention is the mask blank according to any one of claims 1 to 8, wherein a hard mask layer comprised of a material with resistance to a dry etching using fluorine-based gas is provided on the light-shielding layer.

The phase shift mask with regard to the invention in claim 10 of the present invention is a half tone type phase shift mask which applies an ArF excimer laser exposure light, comprising: a transparent substrate; a half-transparent pattern film for controlling a phase and a transmittance of the exposure light, formed on the transparent substrate; a middle pattern film formed on the half-transparent pattern film; and a light-shielding pattern film formed on the middle pattern film; wherein the light-shielding pattern film is comprised of a single metal material not including a transition metal; a film thickness of the light-shielding pattern film is 40 nm or less; and an optical density of a laminated body, in which three kinds of films: the half-transparent pattern film, the middle pattern film, and the light-shielding pattern film are laminated, with respect to the exposure light is a value to the extent that the laminated body functions as a light-shielding region or more.

The phase shift mask with regard to the invention in claim 11 of the present invention is the phase shift mask according to claim 10, wherein the laminated body, in which three kinds of films: the half-transparent pattern film, the middle pattern film, and the light-shielding pattern film are laminated, is adjusted so as to have an optical density with respect to the exposure light being 2.8 or more.

The phase shift mask with regard to the invention in claim 12 of the present invention is the phase shift mask according to claim 10 or 11, wherein a relation between a transmittance T with respect to the exposure light of the half-transparent pattern film and a film thickness "d" of the light-shielding pattern film is: in the range of 23 nm≤d≤27 nm when T=6%; in the range of 31 nm≤d≤35 nm when T=20%; in the range of 33 nm≤d≤37 nm when T=30%.

The phase shift mask with regard to the invention in claim 13 of the present invention is the phase shift mask according to any one of claims 10 to 12, wherein the light-shielding pattern film is comprised of the single metal material with a reflective index "n" being 1.0 or less and an extinction coefficient "k" being 2.0 or more.

The phase shift mask with regard to the invention in claim 14 of the present invention is the phase shift mask according to any one of claims 10 to 13, wherein the single metal material is silicone.

The phase shift mask with regard to the invention in claim 15 of the present invention is the phase shift mask according to anyone of claims 10 to 14, wherein the half-transparent pattern film is comprised of $Si_xO_{1-x-y}N_y$ ("x" and "y" satisfy $0<x<1$, $0<y<1$, and $0<x+y\leq1$).

The phase shift mask with regard to the invention in claim 16 of the present invention is the phase shift mask according to any one of claims 10 to 15, wherein the middle pattern film is comprised of a material with resistance to a dry etching using fluorine-based gas.

The phase shift mask with regard to the invention in claim 17 of the present invention is the phase shift mask according to any one of claims 10 to 16, wherein the middle pattern film is comprised of a chrome-based material containing chrome (Cr), and a film thickness of the middle pattern film is in the range of 2 nm to 5 nm.

The producing method for a phase shift mask with regard to the invention in claim 18 of the present invention is the method comprising steps of: preparing a mask blank with a hard mask layer comprising a transparent substrate, a half-transparent layer for controlling a phase and a transmittance of the exposure light, formed on the transparent substrate, a middle layer formed on the half-transparent layer, and a light-shielding layer formed on the middle layer, in which a hard mask layer is formed on the light-shielding layer of the mask blank, the light-shielding layer is comprised of a single metal material not including a transition metal; forming a first resist pattern film on the hard mask layer; forming a first form of a hard mask pattern film by etching the hard mask layer exposed from the first resist pattern film; forming a first form of a light-shielding pattern film by etching the light-shielding layer exposed from the first form of a hard mask pattern film by using the middle layer as an etch stopping layer; removing the first resist pattern film; forming a second resist pattern film that covers a desired region of the first form of a hard mask pattern film and a desired region of the middle layer exposed from the first form of a light-shielding pattern film; forming a second form of a hard mask pattern film and a first form of a middle pattern film by etching the first form of a hard mask pattern film exposed from the second resist pattern film and the middle layer exposed from the second resist pattern film and the first form of a light-shielding pattern film; removing the second resist pattern film; forming a second form of a light-shielding pattern film and a half-transparent pattern film by etching the first form of a light-shielding pattern film exposed from the second form of a hard mask pattern film and the half-transparent layer exposed from the first form of a middle pattern film; and forming a second form of a middle pattern film by etching the second form of a hard mask pattern film and the first form of a middle pattern film exposed from the second form of a light-shielding pattern film, while removing the second form of a hard mask pattern film; in this order.

The producing method for a phase shift mask with regard to the invention in claim 19 of the present invention is the method comprising steps of: preparing a mask blank with a hard mask layer comprising a transparent substrate, a half-transparent layer for controlling a phase and a transmittance of the exposure light, formed on the transparent substrate, a middle layer formed on the half-transparent layer, and a light-shielding layer formed on the middle layer, in which a hard mask layer is formed on the light-shielding layer of the mask blank, the light-shielding layer is comprised of a single metal material not including a transition metal; forming a first resist pattern film on the hard mask layer; forming a first form of a hard mask pattern film by etching the hard mask layer exposed from the first resist pattern film; forming a first form of a light-shielding pattern film by etching the light-shielding layer exposed from the first form of a hard mask pattern film by using the middle layer as an etch stopping layer; forming a first form of a middle pattern film by etching the middle layer exposed from the first form of a light-shielding pattern film; removing the first resist pattern film; forming a second resist pattern film that covers a desired region of the first form of a hard mask pattern film; forming a second form of a hard mask pattern film by etching the first form of a hard mask pattern film exposed from the second resist pattern film; removing the second resist pattern film; forming a second form of a light-shielding pattern film and a half-transparent pattern film by etching the first form of a light-shielding pattern film exposed from the second form of a hard mask pattern film and the half-transparent layer exposed from the first form of a middle pattern film; and forming a second form of a middle pattern film by etching the second form of a hard mask pattern film and the first form of a middle pattern film exposed from the second form of a light-shielding pattern film, while removing the second form of a hard mask pattern film; in this order.

Advantageous Effects of Disclosure

According to the present invention, provided is a light-shielding pattern film having high light-shielding property with respect to exposure light even when being thinned so as to allow the value of EMF bias to be decreased, and thus a half tone phase shift mask with favorable pattern processability, excellent chemical and light resistance, and suitable for lithography technique on wafer from half pitch 40 nm on, may be obtained.

DESCRIPTION OF EMBODIMENTS

A mask blank, a phase shift mask, and a producing method thereof with regard to the present invention will be hereinafter described in detail with reference to the drawings.

<Mask Blank>

First, a mask blank of the present invention will be described.

Figure 1A:
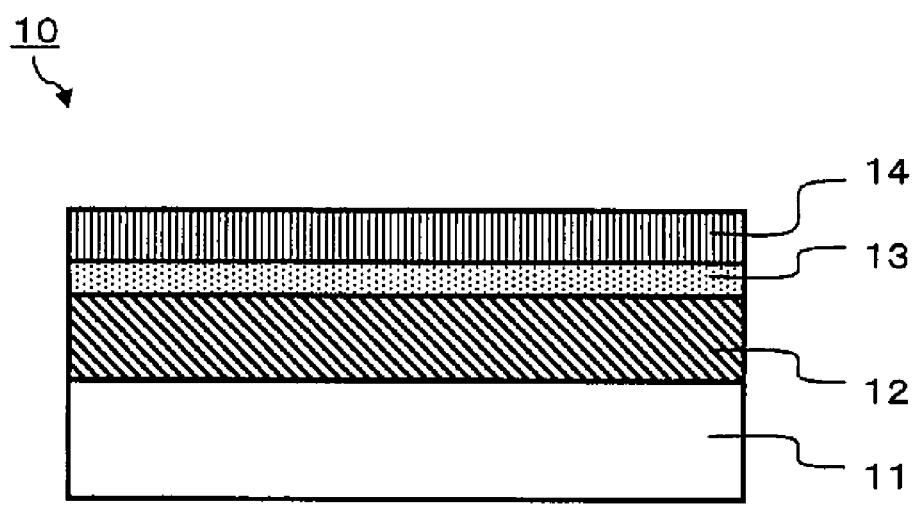
FIGS. 1A and 1B are schematic sectional views illustrating an example of a mask blank of the present invention.
Figure 1B:
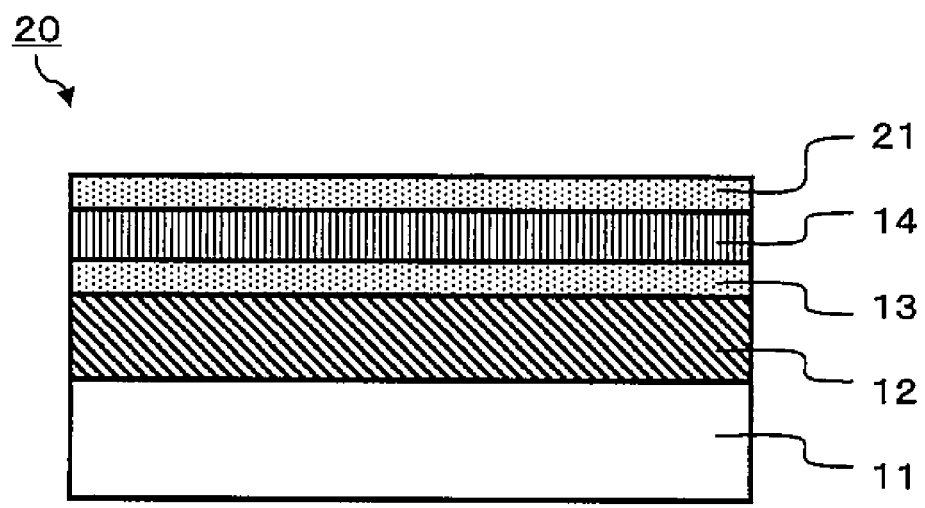

FIGS. 1A and 1B are schematic sectional views illustrating an example of a mask blank of the present invention. Here, a mask blank 20 illustrated in FIG. 1B is a mask blank 10 illustrated in FIG. 1A with a hard mask layer 21 on the light-shielding layer 14.

As illustrated in FIG. 1A, the mask blank 10 in the present embodiment has a transparent substrate 11, a half-transparent layer 12 formed thereon, a middle layer 13 formed on the half-transparent layer 12, and a light-shielding layer 14 formed on the middle layer 13.

Then, the light-shielding layer 14 is comprised of a single metal material not including a transition metal; the film thickness of the light-shielding layer is 40 nm or less; and an optical density of a laminated body, in which three kinds of layers: the half-transparent layer, the middle layer, and the light-shielding layer are laminated, with respect to the Arf excimer laser exposure light is a value to the extent that the laminated body functions as a light-shielding region or more, specifically 2.8 or more is preferable. The mask blank 10 of the present embodiment will be hereinafter described in each constitution, such as a transparent substrate 11, a half-transparent layer 12, a middle layer 13, and a light-shielding layer 14.

(1) Transparent Substrate

In the present embodiment, materials such as optically polished synthetic quartz glass, fluorite, and calcium fluoride that transmits exposure light with high transmittance may be used for the transparent substrate 11, but synthetic quartz glass is usually preferable because it is multiply applied and thus the quality is stable, and also for the reason of its high transmittance of exposure light with short wavelength.

(2) Half-Transparent Layer

In the present embodiment, the half-transparent layer 12 works as a half tone layer for controlling a phase and a transmittance of the Arf excimer laser exposure light; the material therefor is not particularly limited, and a material used for a conventional half tone type phase shift mask may be used.

For example, a film comprised of $Si_xO_{1-x-y}N_y$ ("x" and "y" satisfy $0<x<1$, $0<y<1$, and $0<x+y\leq1$), which is a silicon nitride (SiN) based material, or a molybdenum silicide (MoSi) based material such as a molybdenum silicide oxide film (MoSiO), a molybdenum silicide nitride film (MoSiN), and a molybdenum silicide oxide nitride film (MoSiON), may be used.

In addition, among these, the film comprised of $Si_xO_{1-x-y}N_y$, which is a silicon nitride (SiN) based material, is preferable. The reason therefor is because the half-transparent layer 12 is allowed to have higher transmittance as the transmittance of ArF excimer laser exposure light and be thinner, compared to those used for a conventional half tone type phase shift mask including the molybdenum silicide (MoSi) based material film. Further, the film comprised of $Si_xO_{1-x-y}N_y$ is not particularly limited, but in specific, the one having an extinction coefficient "k" in wavelength of an ArF excimer laser exposure light being in a range of 0.2 to 0.45, a refractive index "n" in wavelength of an ArF excimer laser exposure light being in a range of 2.3 to 2.7, and a transmittance in wavelength of an ArF excimer laser exposure light being 15% to 38%, is preferable. In specific, the reason therefor is because the half-transparent layer 12 is allowed to have higher transmittance and be thinner.

Thereby, when producing a pattern forming body by using a phase shift mask formed from the mask blank of the present invention so as to improve the contrast of a transferring image by making the light strength to be zero due to interference of light by a phase effect at the border of patterns, the half-transparent layer 12 may have higher light transmittance, and the phase effect may be more remarkable. Also, the film comprised of $Si_xO_{1-x-y}N_y$ does not contain a metal, so that an oxide film of silicon (Si) does not grow even though an ArF excimer laser exposure light is irradiated for a long time, and thus a pattern size (Critical Dimension) is prevented from being changed. Similarly, the pattern size change may be prevented also in a step of washing a phase shift mask. Accordingly, the transferring property may be excellent, and an ArF excimer laser exposure light irradiation resistance and resistant to washing may be improved in a photolithography.

Also, when a half-transparent layer 12 has higher light transmittance, the whole thickness of the middle layer 13 and the light-shielding layer 14 required for making an optical density of the laminated body, in which three kinds of films: the half-transparent pattern film, the middle pattern film, and the light-shielding pattern film are laminated, with respect to the Arf excimer laser exposure light to be a value to the extent that the laminated body functions as a light-shielding region or more, particularly preferably 2.8 or more, becomes thick. Accordingly, in this case, as described later, when the middle layer 13 is comprised of a chrome-based material containing chrome (Cr) and the light shielding layer 14 is comprised of silicone, which is a single metal material, the effect capable of thinning the whole thickness of the middle layer 13 and the light-shielding layer 14 required for making an optical density of the laminated body with respect to the exposure light to be a value to the extent that the laminated body functions as a light-shielding region or more, particularly preferably 2.8 or more, by thinning the middle layer 13 becomes remarkable, since the original whole thickness of the middle layer 13 and the light-shielding layer 14 becomes thick. Thereby, an effect of inhibiting the EMF bias value of a phase shift mask from increasing becomes remarkable. Then, above all, as described later, these effects become even more remarkable when the thickness of the middle layer 13 is thinned to be 5 nm or less. In these manners, a film comprised of $Si_xO_{1-x-y}N_y$, which is a silicon nitride (SiN) based material, is preferable among above described materials.

Accordingly, when a film comprised of $Si_xO_{1-x-y}N_y$ is used as the half-transparent layer 12, and if the middle layer 13 is comprised of a chrome-based material containing chrome (Cr) and the light-shielding layer 14 is comprised of silicon, which is a single metal material, the half-transparent layer 12 is allowed to be thinner and the whole thickness of the middle layer 13 and the light shielding layer 14 is allowed to be remarkably thin. Thereby, a malfunction such as a pattern collapse can be prevented in the later-described half-transparent pattern film 32 formed from the half-transparent layer 12; or the increase in the value of EMF bias in the phase shift mask can be remarkably avoided at the same time as allowing the processing of the half-transparent layer 12 and the correcting of the later-described half-transparent pattern film 32 to be easily conducted. Also, this effect becomes even more remarkable when the thickness of the middle layer 13 is thinned to 5 nm or less.

Also, a film comprised of $Si_xO_{1-x-y}N_y$ is not particularly limited, but the composition ratio "y" of silicone (Si) is preferably in a range of 0.4 to 0.6. The reason therefor is because if the ratio does not reach the range, the above-described desired transmittance range may not be reached; and if the ratio exceeds the range, the above-described desired transmittance range may be exceeded.

In addition, the film comprised of $Si_xO_{1-x-y}N_y$ is not particularly limited, but the composition ratio "x" of silicone (Si) and the composition ratio "y" of nitride (N) preferably satisfy $0.95 \leq x+y \leq 1$; above all, preferably satisfy $x+y=1$, substantially. If large amount of oxygen (O) is present in the film comprised of $Si_xO_{1-x-y}N_y$, an extinction coefficient "k" becomes low so that the transmittance becomes high; as the result, a refractive index "n" becomes low. Thereby, the film thickness of the film comprised of $Si_xO_{1-x-y}N_y$ for obtaining a phase difference of 180° becomes thick. Here, the description that the composition ratio "x" of silicone (Si) and the composition ratio "y" of nitride (N) substantially satisfy $x+y=1$ means not substantially containing oxygen (O). The range of $x+y$ in which the composition ratio "x" of silicone (Si) and the composition ratio "y" of nitride (N) substantially satisfy $x+y=1$ is in a range of 0.97 to 1.00, and above all, preferably in a range of 0.98 to 1.00.

Also, the film comprised of $Si_xO_{1-x-y}N_y$ is not particularly limited, but the composition ratio "x" of silicone (Si) and the composition ratio "y" of nitride (N) preferably satisfy $x=y$, substantially. The reason therefor is because a fine film of silicone (Si) and nitride (N) may be obtained thereby and thus improvement in the resistances such as resistance to washing and ArF excimer laser exposure light irradiation resistance may be expected. Here, the description that the composition ratio "x" of silicone (Si) and the composition ratio "y" of nitride (N) substantially satisfy $x=y$ means that the ratio of "x" and "y" is in a range of "x": "y"=0.4:0.6 to 0.6:0.4.

Patterns may be formed by dry etching using fluoride-based gas such as $CF_4$, $CHF_3$, $C_2F_6$, the mixture gas of these, or the mixture gas of these in which diluent gas such as oxygen is mixed as the etching gas, when the half-transparent layer 12 is comprised of the silicon nitride based material, for example.

Also, the method for forming the film comprised of $Si_xO_{1-x-y}N_y$ is not particularly limited, but a film forming method such that the film comprised of $Si_xO_{1-x-y}N_y$ is formed by using a target comprised of silicon (Si) as the spattering target, spattering with the appropriately selected spattering gas and film forming conditions so as to obtain the desired composition ratio of $Si_xO_{1-x-y}N_y$ ("x" and "y" satisfy $0<x<1$, $0<y<1$, and $0<x+y\leq 1$) that comprises the film comprised of $Si_xO_{1-x-y}N_y$.

Further, the film thickness of the film comprised of $Si_xO_{1-x-y}N_y$ is not particularly limited, but is preferably in the range of 57 nm to 67 nm. The reason therefor is because if the film thickness is in the range of 57 nm to 67 nm, the half-transparent pattern film may be easily formed by etching since the film thickness of the half-transparent layer 12 becomes thinner than the thickness of a conventional half-transparent layer. In addition, required time for the etching becomes short thereby and thus, as described later, even when an etching barrier layer for preventing the transparent substrate 11 from being damaged is not arranged between the transparent substrate 11 and the half-transparent layer 12, the damage to the transparent substrate 11 can be sufficiently avoided at the time of forming the half-transparent pattern film by the etching.

Also, the film thickness of the film comprised of $Si_xO_{1-x-y}N_y$ is preferably in a range of 57 nm to 64 m above all, and is particularly preferably in a range of 57 nm to 62 nm. The reason therefor is because a thinner film thickness of the film comprised of $Si_xO_{1-x-y}N_y$ may prevent a malfunction such as a pattern collapse in the later-described half-transparent pattern film formed from the film comprised of $Si_xO_{1-x-y}N_y$ from occurring, and may allow the processing of the film comprised of $Si_xO_{1-x-y}N_y$ and the correcting of the half-transparent pattern film to be easy.

Also, the film thickness of the film comprised of $Si_xO_{1-x-y}N_y$ may be measured by the ellipsometer VUV-VASE™ manufactured by J.A. Woollam Co., and defined.

On the other hand, as described later, if the light-shielding layer 14 is comprised of silicon (Si), which is a single metal material, and when the above described film, which is a molybdenum silicide based material is used as the half-transparent layer 12, molybdenum (Mo) is easily spread from the half-transparent layer 12 comprised of a molybdenum silicide (MoSi) based material to the light-shielding layer 14 comprised of silicon (Si), compared to the case of using a film comprised of $Si_xO_{1-x-y}N_y$ that is the silicon nitride based material. Accordingly, as described later, it is advantageous that the middle layer 13 particularly favorably works as a spread preventing layer that prevent the materials comprising each layer from being spread to each other between the light-shielding layer 14 comprised of silicon which is a single metal material and the half-transparent layer 12.

Also, when the half-transparent layer 12 is comprised of a molybdenum silicide based material, patterns may be formed by dry etching using fluoride-based gas such as $CF_4$, $CHF_3$, $C_2F_6$, the mixture gas of these, or the mixture gas of these in which diluent gas such as oxygen is mixed as the etching gas.

Also, when the half-transparent layer 12 is a molybdenum silicide oxide film (MoSiO), the forming method of the half-transparent layer 12 is not particularly limited, but it may be formed by a reactive spattering method by using a mixture target of molybdenum and silicon (Mo:Si=1:2 mol %) under mixture gas atmosphere of argon and oxygen.

Here, a half-transparent layer used for a conventional half tone type phase shift mask has been designed so as to have the transmittance with respect to the exposure light becomes about 6% mainly.

On the other hand, the half-transparent layer 12 of the present embodiment may be designed so as to have higher transmittance (such as about 30%) since the mask blank of the present invention is the form that has a light-shielding pattern film on a half-transparent pattern film (try tone mask) when processed as a phase shift mask. Then, the phase effect may be further improved if the half-transparent layer 12 has higher transmittance.

(3) Middle Layer

In the present embodiment, the middle layer 13 works as an etching stopping layer during an etching process of the light-shielding layer 14 and as an etching mask during the etching process of the half-transparent layer 12. Also, the middle layer 13 works as a spread preventing layer for preventing a material, which comprises the light-shielding layer 14, from being spread from the light-shielding layer 14 to the half-transparent layer 12.

As described above, a silicon nitride (SiN) based compound or a molybdenum silicide (MoSi) based compound is preferably used for the half-transparent layer 12; the middle layer 13 is preferably comprised of a material having resistance to a dry etching using fluoride-based gas, since these silicon nitride (SiN) based compound and molybdenum silicide (MoSi) based compound are mainly processed by dry etching using fluoride-based gas.

Specific examples of the material comprising this middle layer 13 are a chrome-based material such as Cr, CrO, CrN, and CrNO, and a tantalum-based material such as Ta, TaO, TaN, and TaNO.

These materials comprising the middle layer 13 are preferably a chrome-based material containing chrome (Cr) such as Cr, CrO, CrN, and CrNO, above all. As described later, the reason therefor is to suitably work as a spread preventing layer for preventing materials, which comprise each layer, from being spread between the light-shielding layer 14 and the half-transparent layer 12 when the light-shielding layer 14 is comprised of silicon, which is a single metal material. In particular, when the half-transparent layer 12 is comprised of a molybdenum silicide compound (MoSi) and the light-shielding layer 14 is comprised of silicon (Si) which is a single metal material, the middle layer 13 suitably works as a spread preventing layer for preventing molybdenum (Mo) from spreading from the half-transparent layer 12 to the light-shielding layer 14. Thereby, the middle layer 13 particularly suitably works as a spread preventing layer for preventing materials, which comprise each layer, from being spread to each other between the light-shielding layer 14 and the half-transparent layer 12.

Also, among these chrome-based materials, CrN, CrON, and CrO are preferable. The reason therefor is because a film comprised of CrN, CrON, and CrO is formed by a reactive spattering method under a nitride gas, oxygen gas, or mixture of these gases atmosphere, so that the stability during the film formation is higher and the pattern processability is excellent compared to a chrome film (Cr) formed by a reactive spattering method under argon gas atmosphere. Further, CrN is particularly preferable among CrN, CrON, and CrO. The reason therefor is because CrN is a material not including oxygen (O), so that the film thickness of a CrN film becomes thinner than the film thickness of a film comprised of CrON and CrO. Thereby, the film thickness of the middle layer 13 may be thin so as to thin the whole film thickness of the middle layer 13 and the light-shielding layer 14 required for making an optical density of the laminated body with respect to the Arf excimer laser exposure light to be a value to the extent that the laminated body functions as a light-shielding region or more, particularly preferably 2.8 or more.

Incidentally, the middle layer 13 may be a single layer structure that is comprised of a same material, and may be a plural layer structure that is comprised of different materials.

The film thickness of the middle layer 13 may be the thickness enough to work as an etching stopping layer during an etching process of the light-shielding layer 14, as an etching mask during an etching process of the half-transparent layer 12, and as a spread preventing layer for preventing the material, which comprises the light-shielding layer 14, from being spread from the light shielding layer 14 to the half-transparent layer 12, but exceedingly thick layer may unwillingly increase the value of EMF bias in the phase shift mask. Accordingly, the film thickness of the middle layer 13 is preferably in a range of 2 nm to 5 nm.

Also, above all, the film thickness of the middle layer 13 is preferably in a range of 2 nm to 5 nm when the middle layer 13 is comprised of a chrome-based material containing chrome (Cr). The reason therefor is because if the range is not reached, the film thickness is too thin to form middle layer 13 to be fine film and holes may be formed in the middle layer 13, and thus it becomes difficult to prevent the materials comprising each layer from being spread to each other between the light-shielding layer 14 and the half-transparent layer 12. In particular, it is because the middle layer 13 may have difficulty in suitably working as a spread preventing layer for preventing molybdenum (Mo) from spreading from the half-transparent layer 12 to the light-shielding layer 14, when the half-transparent layer 12 is comprised of a molybdenum silicide compound (MoSi) and the light-shielding layer 14 is comprised of silicon (Si) which is a single metal material. Thereby, the middle layer 13 may have difficulty in suitably working as a spread preventing layer for preventing the materials comprising each layer from being spread to each other between the light-shielding layer 14 and the half-transparent layer 12. If the range is exceeded, the whole film thickness of the middle layer 13 and the light-shielding layer 14 becomes too thick when the light-shielding layer is comprised of silicon, which is a single metal material, and thus the value of EMF bias in the phase shift mask is unwillingly increased.

The effect obtained by thinning the film thickness of the middle layer 13 when the middle layer 13 is comprised of a chrome-based material containing chrome (Cr), and the light-shielding layer 14 is comprised of silicon, which is a single metal material, will be hereinafter described in details.

As described above, the optical density of the laminated body, in which three kinds of films: the half-transparent pattern film, the middle pattern film, and the light-shielding pattern film are laminated, with respect to the Arf excimer laser exposure light is required to be 2.8 or more. Also, the extinction coefficient "k" of a layer comprised of silicon (Si), which is a single metal material, is larger than that of a layer comprised of a chrome-based material containing chrome (Cr). For that reason, while making the film thickness of the middle layer comprised of a chrome-based material containing chrome (Cr) thin, and decreasing the ratio of the optical density to be obtained in the middle layer 13 thereby; the light-shielding layer 14 comprised of silicon (Si), which is a single metal material, is thickened so as to increase the ratio of optical density to be obtained in the light-shielding layer 14; and thus allowed is the effect capable of thinning the whole thickness of the middle layer 13 and the light-shielding layer 14 required for making an optical density of the laminated body with respect to the ArF excimer laser exposure light to be 2.8 or more. Thereby, obtained is the effect capable of avoiding the increase in the value of EMF bias in a phase shift mask. Then, above all, these effects become remarkable when the thickness of the middle layer 13 is 5 nm or less not exceeding the above range.

A conventionally known vacuum film forming method may be used for forming the middle layer 13; for example, when the middle layer 13 is a chromium (Cr) film, it may be formed by a reactive spattering method by using a chrome target under argon gas atmosphere.

(4) Light-Shielding Layer

In the present embodiment, the light-shielding layer 14 is comprised of a single metal material not including a transition metal. A layer of the single metal material that comprises the light-shielding layer 14 may be formed by a usual film forming method such as a spattering method. The film of a single metal material may be formed by using the single metal material target at the time of the spattering; and comprised of a single metal material film substantially not including other elements.

In the present invention, a formation other than the film of the single metal material such as mixture of other metals, or formation of oxides and nitrides is not intended; thus oxygen or nitrogen gas insertion is not conducted during the film formation. However, if small amount of substances such as oxygen remained in the apparatus is unintentionally taken in the surface of the formed film; the formed film is substantially included in the light-shielding layer comprised of a single metal material in the present invention.

In other words, in the present invention, "the light-shielding layer comprised of a single metal material not including a transition metal" means that the light shielding layer is substantially comprised of a single metal material. For that reason, "the light-shielding layer comprised of a single metal material not including a transition metal" in the present invention may contain impurity that does not affect the functions and properties of the light-shielding layer. Such impurity is not particularly limited, but examples thereof may include carbon, oxygen, nitrogen, boron, helium, hydrogen, argon, and xenon. In addition, the ratio of such impurity in the light-shielding layer is not particularly limited, but is preferably 0% or more and 5% or less; above all, preferably 0% or more and 2% or less, and particularly preferably 0% or more and 1% or less.

Also, in the present embodiment, the film thickness of the light-shielding layer 14 is 40 nm or less, and the optical density of the laminated body, in which three kinds of layers: the half-transparent layer, the middle layer, and the light-shielding layer are laminated, with respect to the ArF excimer laser exposure light is a value to the extent that the laminated body functions as a light-shielding region or more, which is particularly preferably 2.8 or more. Here, "the light-shielding region" refers to the region in which unnecessary exposure light among the exposure light transmitting the half-transparent pattern film for transferring a mask pattern to the transfer target is light-shielded by the middle pattern film and the light-shielding pattern film in the later-described phase shift mask (halftone type phase shift mask) of the present invention, formed from the mask blank of the present invention. Also, "function as the light-shielding region" means that the region functions so as to light-shield the unnecessary exposure light among the exposure light transmitting the half-transparent pattern film for transferring a mask pattern to the transfer target.

Here, the film thickness of the light-shielding layer 14 may be changed in the range that satisfies the above described optical density. In other words, if the transmittance of the half-transparent layer 12 is small, the film thickness of the light-shielding layer 14 may be thinned in accordance therewith.

In the present embodiment, the relation between a transmittance T with respect to the exposure light of the half-transparent layer and a film thickness "d" of the light-shielding layer is: more preferably in the range of 23 nm≤d≤27 nm when T=6%, in the range of 31 nm≤d≤35 nm when T=20%, and in the range of 33 nm≤d≤37 nm when T=30%.

Also, in the present embodiment, the light-shielding layer 14 is preferably comprised of the single metal material with a refractive index "n" being 1.0 or less and an extinction coefficient "k" being 2.0 or more; and this single metal material is more preferably silicon (Si). The reason therefor is because the higher extinction coefficient "k" allows thinner film thickness of the light-shielding layer 14 required for making an optical density of the laminated body with respect to the ArF excimer laser exposure light to be a value to the extent that the laminated body functions as a light-shielding region or more, which is particularly preferably 2.8 or more. Thereby, the increase in the value of EMF bias in the phase shift mask may be avoided. Also, the extinction coefficient of silicon (Si) is high among that of such single metal materials.

In terms of formation of the above-described light-shielding layer 14, for example, the layer may be formed by a reactive spattering method, using silicon crystal not including impurity ion as the target, under argon (Ar) gas atmosphere.

In the present embodiment, examples of the transition metal not included in the light-shielding layer may be molybdenum (Mo), tantalum (Ta), and tungsten, but in particular, molybdenum (Mo) is exemplified as the transition metal not included in the light-shielding layer.

As described above, molybdenum forms a molybdenum silicide compound (MoSi) by compounding with silicon, which is used as a light-shielding pattern film of a binary type photo mask, for example. However, chemical and light resistance is not sufficient in a light-shielding pattern film using a molybdenum silicide (MoSi) based material; and a mask pattern size (CD size) change may occur in a binary type photo mask using a molybdenum silicide (MoSi) based material for the light-shielding pattern film during the mask washing and ArF excimer laser light exposure. Accordingly, the light-shielding layer in the present invention is comprised of the single metal material not including a transition metal such as molybdenum. Furthermore, more preferable form of the light-shielding layer is comprised of silicon.

Also, in a light-shielding layer comprised of silicon, the pattern forming is easy since it shows faster etching speed in an etching using fluoride based gas compared to a conventional molybdenum silicide based light-shielding layer; in addition, film thinning of a resist is also possible, so that the resolution property may be improved.

Also, the mask blank of the present invention may be a mask blank 20 as shown in FIG. 1B, in the form of having a hard mask layer 21 on the light-shielding layer 14. Such form allows processing the light-shielding layer 14 by using the hard mask layer 21 as the etching mask, so as to make a resist layer further thinner.

As described above, silicon is preferably used for the light-shielding layer 14; this silicon is mainly processed by a dry etching using fluoride based gas, and thus the hard mask layer 21 is preferably comprised of a material having resistance to the dry etching using fluoride based gas. Specific examples of the material that comprises this hard mask layer 21 may include a chrome-based material such as Cr, CrO, CrN, and CrNO, and a tantalum-based material such as Ta, TaO, TaN, and TaNO. The film thickness of the hard mask layer 21 is in the range of 2 nm to 5 nm, for example.

Incidentally, the hard mask layer 21 may be a single layer structure comprised of a same material, and may be a plural layer structure comprised of different materials.

A conventionally known vacuum film forming method may be used for forming the hard mask layer 21; for example, if the hard mask layer 21 is a chrome layer (Cr), it may be formed by a reactive spattering method using a chromium target under argon gas atmosphere.

(5) Others

Also, as for a combination of the middle layer 13 and the light-shielding layer 14, the combination of the middle layer 13 comprised of the above-described chrome-based material and the light-shielding layer 14 comprised of silicon (Si), which is the above-described single metal material, is preferable. The reason therefor is because the extinction coefficient "k" of silicon, which is the single metal material, is larger compared to that of the chrome-based material, and thus the difference in extinction coefficient "k" of both is large. Thereby, as described above, obtained by thinning the middle layer 13 is the effect capable of thinning the film thickness of the light-shielding layer 14 required for making an optical density of the laminated body with respect to the ArF excimer laser exposure light to be a value to the extent that the laminated body functions as a light-shielding region or more, which is particularly preferably 2.8 or more. In addition, this effect becomes remarkable when the film thickness of the middle layer 13 is 5 nm or less.

<Phase Shift Mask>

Next, the phase shift mask of the present invention will be described.

Figure 2A:
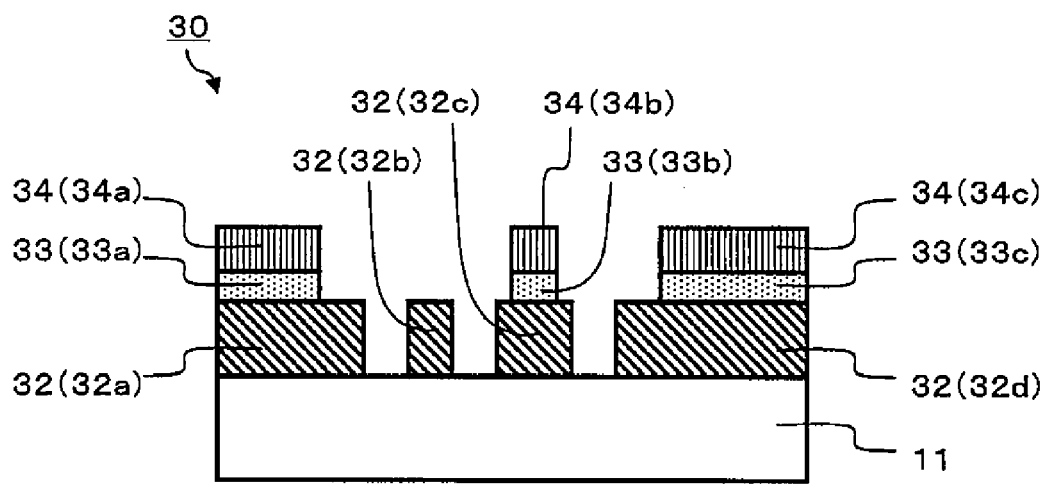
FIGS. 2A and 2B are schematic sectional views illustrating an example of a phase shift mask of the present invention.
Figure 2B:
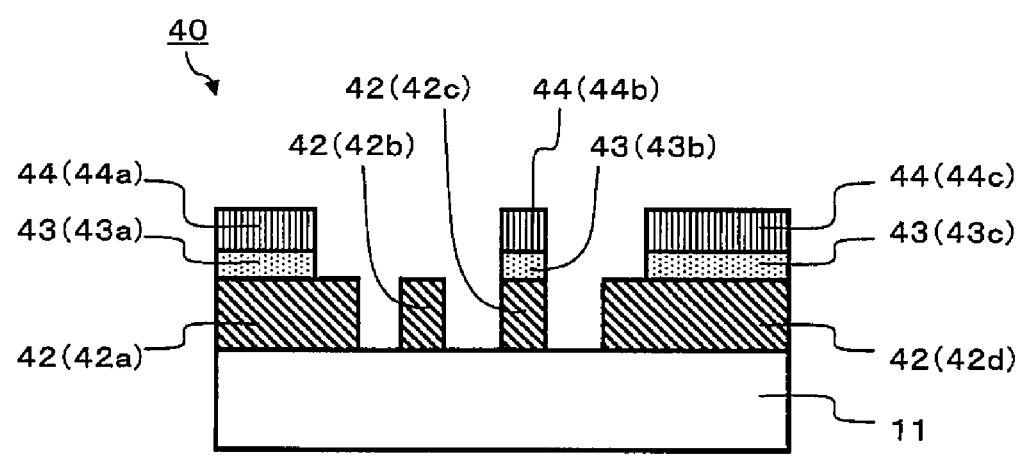

FIGS. 2A and 2B are schematic sectional views illustrating an example of a phase shift mask of the present invention.

For example, as shown in FIG. 2A, a phase shift mask 30 of the present embodiment has a transparent substrate 11, a half-transparent pattern film 32 formed thereon, a middle pattern film 33 formed on the half-transparent pattern film 32, and a light-shielding pattern film 34 formed on the middle pattern film 33. In addition, the light-shielding pattern film 34 is comprised of a single metal material not including a transition metal; the film thickness of the light-shielding pattern film 34 is 40 nm or less; and an optical density of a laminated body, in which three kinds of films: the half-transparent pattern film, the middle pattern film, and the light-shielding pattern film are laminated, with respect to the ArF excimer laser exposure light is a value to the extent that the laminated body functions as a light-shielding region or more, which is particularly preferably 2.8 or more.

The phase shift mask 30 of the present embodiment may be produced from the above-described mask blank 10 or mask blank 20. In other words, the half-transparent pattern film 32 in the phase shift mask 30 may be obtained by processing the half-transparent layer 12 in the mask blank 10 to be a pattern shape, and the light-shielding pattern film 34 may be obtained by processing the light-shielding layer 14 to be a pattern shape.

On the left side of the phase shift mask 30 in the schematic sectional view shown in FIG. 2A, a middle pattern film 33a and a light-shielding pattern film 34a are formed on a half-transparent pattern film 32a; similarly, on the right side of the phase shift mask 30, a middle pattern film 33c and a light-shielding pattern film 34c are formed on a half-transparent pattern film 32d.

These regions in which the light-shielding pattern film 34a and the light-shielding pattern film 34c are formed, are peripheral portions of the region (effective region) in which a mask pattern is formed; that is corresponding to the region in which a light-shielding belt has been arranged in a conventional half tone type phase shift mask.

In a conventional half tone type phase shift mask, unnecessary exposure light transmitted from the peripheral portion has been light-shielded by utilizing interference of light caused by patterns formed in the light-shielding belt; in the phase shift mask 30 of the present embodiment, unnecessary exposure light can be certainly light-shielded by the light-shielding pattern film 34a and the light-shielding pattern film 34c.

Also, as for a mask pattern in the effective region, the phase shift mask 30 has a portion comprised of only a half-transparent pattern film 32b (single layer structural portion), and a portion comprised of three kinds of films: the half-transparent pattern film 32c, the middle pattern film 33b, and the light-shielding pattern film 34b (laminated structural portion).

The area of the half-transparent pattern film 32c in the laminated structural portion is usually bigger than the area of the half-transparent pattern film 32c in the single layer structural portion; thus, unnecessary exposure light transmitting the half-transparent pattern film is certainly light-shielded by arranging the light-shielding pattern film 34b in the laminated structural portion. In the phase shift mask 30, an edge portion of the half-transparent pattern film 32c is designed to be exposed from the light-shielding pattern film 34b, so as not to negate the phase effect by the half-transparent pattern film 32c in the laminated structural part.

Incidentally, the present invention may have a laminated structural portion in a form that the edge portion of the half-transparent pattern film is not exposed from the light-shielding pattern film.

For example, a phase shift mask 40 in a form shown in FIG. 2B has a transparent substrate 11, a half-transparent pattern film 42, a middle pattern film 43 formed on the half-transparent pattern film 42, and a light-shielding pattern film 44 formed on the middle pattern film. 43, similarly to the phase shift mask 30; however, in its effective region, a laminated structural portion is in a form that the edge portion of the half-transparent pattern film 42c is not exposed from the light-shielding pattern film. Such laminated structural portion may be utilized as an alignment mark, for example.

<Producing Method for Phase Shift Mask>

Next, the producing method for the phase shift mask of the present invention will be described.

First Embodiment

FIGS. 3A to 3J are schematic sectional views illustrating an example of a producing method for a phase shift mask 30 in a form shown in FIG. 2A.

Figure 3A:
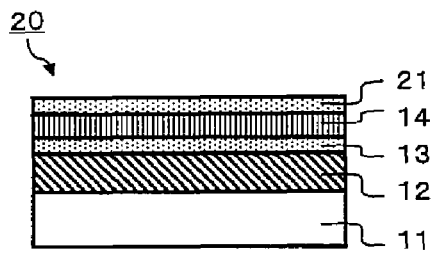
FIGS. 3A to 3J are schematic sectional views illustrating an example of a producing method for a phase shift mask of the present invention.

In order to obtain the phase shift mask 30 by the producing method of the present embodiment, for example, as shown in FIG. 3A, prepared is a mask blank 20 with a hard mask layer, in which a hard mask layer 21 is formed on a light shielding layer 14 of a mask blank 10 having a transparent substrate 11, a half-transparent layer 12 formed on the transparent substrate 11, a middle layer 13 formed on the half-transparent layer, and a light-shielding layer 14 formed on the middle layer 13.

Figure 3F:
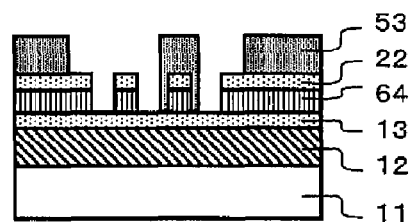
Figure 3B:
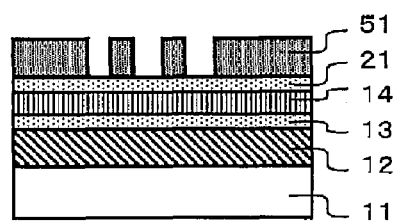
Figure 3G:
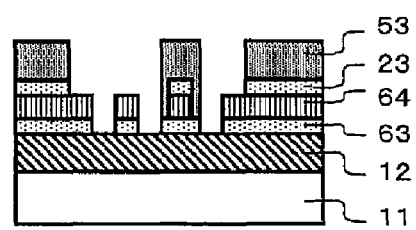
Figure 3C:
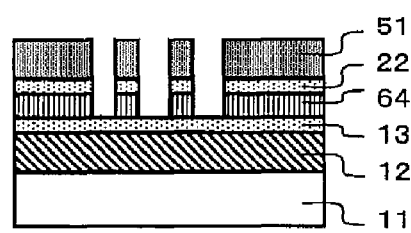

Next, formed on the hard mask layer 21 is a first resist pattern film 51, by a resist plate making using electron beam lithography, for example (FIG. 3B).

Figure 3H:
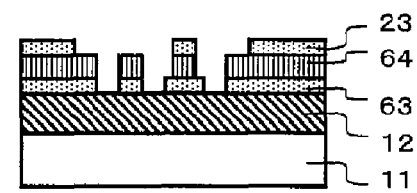
Figure 3D:
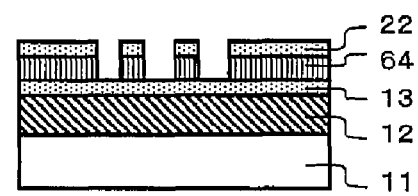
Figure 3I:
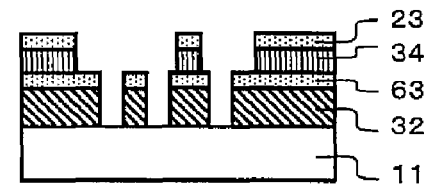
Figure 3E:
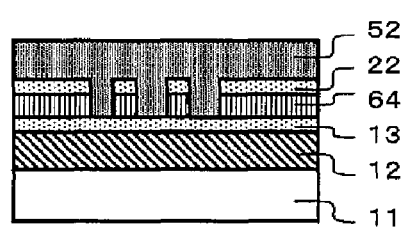

Next, a first form of a hard mask pattern 22 is formed by etching the hard mask layer 21 exposed from the first resist pattern film 51 by dry etching using chlorine-based gas for example; further, a first form of a light-shielding pattern film 64 is formed by etching the light-shielding layer 14 exposed from the first form of the hard mask pattern film 22, by dry etching using fluoride-based gas by means of the middle layer 13 as an etching stopping layer (FIG. 3C); and thereafter removed is the first resist pattern film 51 (FIG. 3D).

Next, a second resist layer 52 is formed on the first form of the hard mask pattern film. 22, as well as on the middle layer 13 exposed from the first form of a light-shielding pattern film 64 (FIG. 3E); then, a second form of the resist pattern film 53 is formed by a resist plate making using electron beam lithography so as to cover the desired region of the first form of the hard mask pattern film 22 and the desired region of the middle layer 13 exposed from the first form of the light-shielding pattern film 64 (FIG. 3F).

Next, by means of dry etching using chlorine-based gas, for example, a second form of a hard mask pattern 23 and a first form of a middle pattern film 63 are formed by etching the first form of the hard mask pattern film 22 exposed from the second resist pattern film 53 as well as the middle layer 13 exposed from the second resist pattern film 53 and the first form of the light-shielding pattern film 64 (FIG. 3G); thereafter removed is the second resist pattern film 53 (FIG. 3H).

Next, a second form of a light-shielding pattern film 34 and a half-transparent pattern film 32 are formed by etching the first form of the light-shielding pattern film 64 exposed from the second form of the hard mask pattern film 23 and the half-transparent layer 12 exposed from the first form of the middle pattern film 63 (FIG. 3I) by dry etching using fluoride-based gas.

Figure 3J:
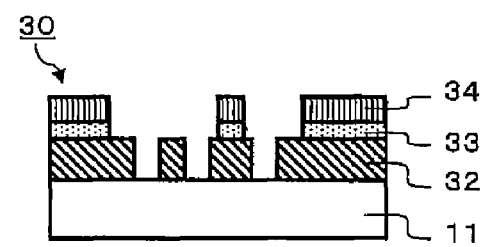

Next, a second form of a middle pattern film 33 is formed by etching the second form of the hard mask pattern film 23 and the first form of the middle pattern film 63 exposed from the second form of the light-shielding pattern film 34 by dry etching using chlorine-based gas, for example, so as to remove the second form of the hard mask pattern film 23; thereby obtained is a phase shift mask 30 (FIG. 3J).

Second Embodiment

FIGS. 4A to 4J are schematic sectional views illustrating an example of a producing method for a phase shift mask 40 in a form shown in FIG. 2B.

Figure 4A:
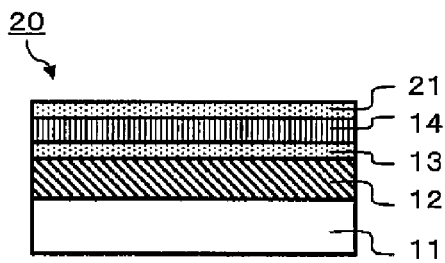
FIGS. 4A to 4J are schematic sectional views illustrating another example of a producing method for a phase shift mask of the present invention.

In order to obtain the phase shift mask 40 by the producing method of the present embodiment, for example, first, as shown in FIG. 4A, prepared is a mask blank 20 with a hard mask layer, in which a hard mask layer 21 is formed on a light-shielding layer 14 of a mask blank 10 having a transparent substrate 11, a half-transparent layer 12 formed on the transparent substrate 11, a middle layer 13 formed on the half-transparent layer, and a light-shielding layer 14 formed on the middle layer.

Figure 4B:
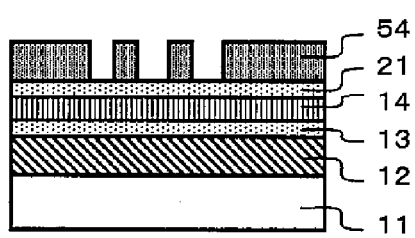
Figure 4C:
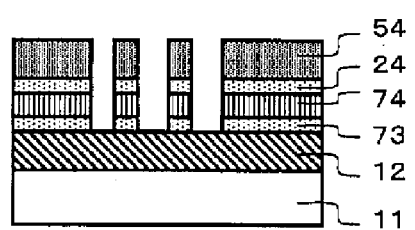

Next, a first resist pattern film 54 is formed on the hard mask layer 21 by means of a resist making plate using electron beam lithography, for example (FIG. 4B).

Figure 4D:
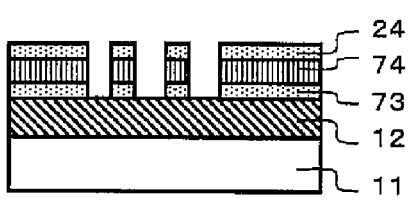
Figure 4E:
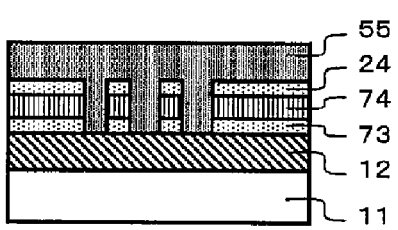

Next, the hard mask layer 21 exposed from the first resist pattern film 54 is etched by dry etching using chlorine-based gas, for example, so as to form a first form of a hard mask pattern film 24; then, the light-shielding layer 14 exposed from the first form of the hard mask pattern film 24 is etched by dry etching using the middle layer 13 as an etching stopping layer and using fluoride-based gas, so as to form a first form of a light-shielding pattern film 74; further, the middle layer 13 exposed form the first form of the light-shielding pattern film 74 is etched so as to form a first form of a middle pattern film 73 (FIG. 4C), and then removed is the first form of the resist pattern 54 (FIG. 4D).

Figure 4F:
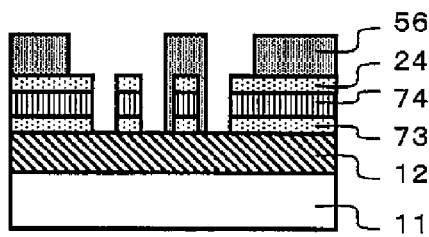
Figure 4G:
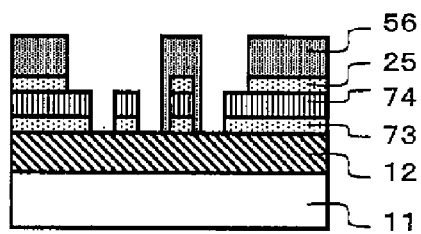

Next, a second form of a resist layer 55 is formed on the first form of the hard mask pattern film 24 as well as on the first form of the middle pattern film 73 (FIG. 4E); then, a second resist pattern film 56 is formed so as to cover the desired region of the first form of the hard mask pattern film 24, by a resist plate making using electron beam lithography, for example (FIG. 4F).

Figure 4H:
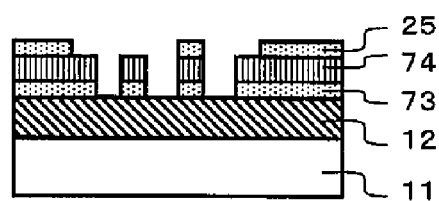

Next, a second form of a hard mask pattern 25 is formed by etching the first form of the hard mask pattern film 24 exposed from the second resist pattern film 56 by dry etching using chlorine-based gas, for example (FIG. 4G), thereafter removed is the second resist pattern film 56 (FIG. 4H).

Figure 4I:
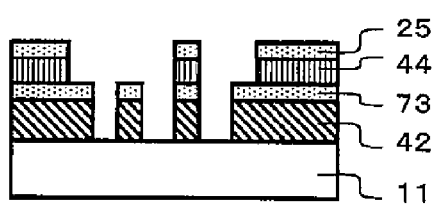

Next, etched by dry etching using fluoride-based gas are the first form of the light-shielding pattern film 74 exposed from the second form of the hard mask pattern film 25 and the half-transparent layer 12 exposed from the first form of the middle pattern film 73, so as to form a second form of a light-shielding pattern film 44 and a half-transparent pattern film 42 (FIG. 4I).

Figure 4J:
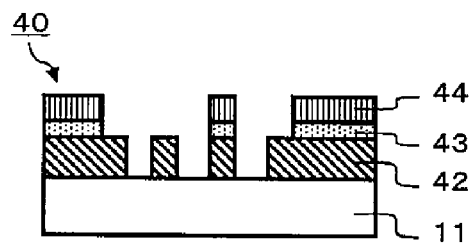

Next, a second form of a middle pattern film 43 is formed by etching the second form of the hard mask pattern film 25 and the first form of the middle pattern film 73 exposed from the second form of the light-shielding pattern film 44 by dry etching using chlorine-based gas, for example, so as to remove the second form of the hard mask pattern film 25; thereby obtained is a phase shift mask 40 (FIG. 4J).

EXAMPLES

More detailed descriptions with reference to examples are as follows.

Example 1-1

Prepared was a mask blank 20 with a hard mask layer by using: an optically polished 6 inch square and 0.25 inch thick synthetic quartz as a transparent substrate 11; a molybdenum silicide oxide film (MoSiO) as a half-transparent layer 12; a 3 nm film-thick chromium film (Cr) as a middle layer 13; a silicon film (Si) as a light-shielding layer 14; and a 2 nm chromium film (Cr) as a hard mask layer 21.

Here, the film thickness of the half-transparent layer 12 was adjusted so that the transmittance with respect to the exposure light became 6%; and the film thickness of the light-shielding layer 14 was adjusted so that the optical density of a laminated body, in which three kinds of layers: the half-transparent layer, the middle layer, and the light-shielding layer are laminated, with respect to the light exposure became 3.0.

The optical density was measured by MCPD3000 manufactured by OTSUKA ELECTRONICS Co., LTD; an optical constant may be obtained by an ellipsometer (manufactured by J.A. Woollam Co.). Also, a film thickness may be obtained by a step measurement using an AFM apparatus (manufactured by SII Nanotechnology Inc.).

Next, coated on the hard mask layer 21 was an electron beam resist to draw and develop patterns by an electron beam lithography apparatus, so as to form a first resist pattern film 51.

Next, firstly formed was a first form of a hard mask pattern film 22 by dry-etching the hard mask layer 21 by using the first resist pattern film 51 as an etching mask with mixture gas of chlorine and oxygen; further, a first form of a light-shielding pattern film 64 was formed by etching a light-shielding layer 14 exposed from the first form of the hard mask pattern film 22 by dry etching using $CF_4$ gas; the first resist pattern film 51 was thereafter removed by ashing with oxygen plasma.

Next, as a second resist layer 52, coated was an electron beam resist on the first form of the hard mask pattern 22 as well as on the middle layer 13 exposed from the first form of the light-shielding pattern film 64; then, patterns were drawn and developed by an electron beam lithography apparatus so as to form a second resist pattern film 53.

Next, etched by means of dry etching using mixture gas of chlorine and oxygen were the first form of the hardmask pattern film 22 exposed from the second resist pattern film 53 as well as the middle layer exposed from the second resist pattern film 53 and the first form of the light-shielding pattern film 64, so as to form a second form of a hard mask pattern film 23 and a first form of a middle pattern film 63; the second resist pattern film 53 was thereafter removed by ashing with oxygen plasma.

Next, etched by dry etching using $SF_6$ gas were the first form of the light-shielding pattern film 64 exposed from the second form of the hard mask pattern film 23 as well as the half-transparent layer 12 exposed from the first form of the middle pattern film 63, so as to form a second form of a light-shielding pattern film 34 and a half-transparent pattern film 32.

Next, a second form of a middle pattern film 33 was formed by etching the second form of the hard mask pattern film 23 as well as the first form of the middle pattern film 63 exposed from the second form of the light-shielding pattern film 34 by dry etching using mixture gas of chlorine and oxygen, so as to remove the second form of the hard mask pattern film 23 to form a second form of a middle pattern film 33, and thereby obtained a phase shift mask 30 for Example 1-1.

In this production, the light-shielding layer of the phase shift mask 30 was a silicon film, so that the etching speed by fluoride-based gas was faster than that of a molybdenum silicide based film, and thus the pattern processability was excellent. Also, the light-shielding layer of the phase shift mask 30 was a silicon film, so that it showed higher chemical and light resistance than those of a molybdenum silicide based film.

Example 1-2

A phase shift mask 30 for Example 1-2 was obtained in the same manner as in Example 1-1, except that the film thickness of the half-transparent layer 12 was adjusted so that the transmittance with respect to the exposure light became 20%, and the film thickness of the light-shielding layer 14 was adjusted so that the optical density of the laminated body, in which three kinds of layers: the half-transparent layer, the middle layer, and the light-shielding layer were laminated, with respect to the exposure light became 3.0.

Example 1-3

A phase shift mask 30 for Example 1-3 was obtained in the same manner as in Example 1-1, except that the film thickness of the half-transparent layer 12 was adjusted so that the transmittance with respect to the exposure light became 30%, and the film thickness of the light-shielding layer 14 was adjusted so that the optical density of the laminated body, in which three kinds of layers: the half-transparent layer, the middle layer, and the light-shielding layer were laminated, with respect to the exposure light became 3.0.

Comparative Example 1-1

Prepared was a binary type photo mask blank wherein a 50 nm film-thick molybdenum silicide nitride film (MoSiN) was formed as a light-shielding layer on a polished 6 inch square and 0.25 inch thick transparent synthetic quartz substrate; and a 3 nm film-thick chromium film was formed thereon as a hard mask layer.

Next, an electron beam resist was coated on a hard mask layer of the blank to draw and develop patterns by an electron beam lithography apparatus, so as to form a resist pattern film in a desired shape.

Next, the chromium film of the hard mask layer was etched by using the resist pattern film as an etching mask with mixture gas of chlorine and oxygen; further, the molybdenum silicide nitride film of the light-shielding layer was dry etched by using $SF_6$ gas so as to form a desired mask pattern; thereafter removed by asking with oxygen plasma was the resist pattern film.

Next, the chromium film of the hard mask layer was etched to remove by mixture gas of chlorine and oxygen, so as to obtain a binary type photo mask for Comparative Example 1-1.

<Relation Between Transmittance of Half-Transparent Layer and Film Thickness of Light-Shielding Layer>

First, the relation between each transmittance of the half-transparent layer 12 and the film thickness of the light-shielding layer 14 in the Examples 1-1 to 1-3 will be described.

The film thickness of the light-shielding layer 14 may be changed in a range that satisfies the above-described optical density. In other words, the film thickness of the light-shielding layer 14 may be thinned when the transmittance of the half-transparent layer 12 is small in accordance therewith. Here, the film thickness of the middle layer 13 is 3 nm, which is extremely thin, and the material is also chromium-based, so the light-shielding property may be ignored.

Figure 5:
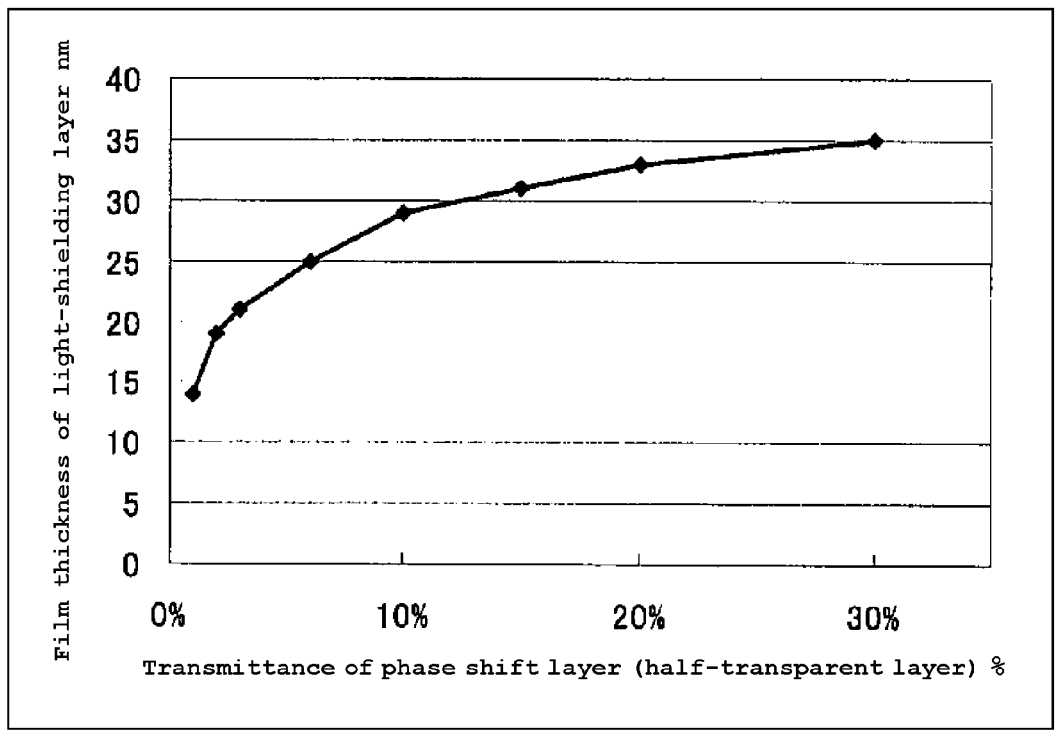
FIG. 5 is a graph showing a relation between a transmittance of a half-transparent layer and a thickness of a light-shielding layer in a mask blank of the present invention.

Accordingly, when a silicon film is used for the light-shielding layer 14, the relation between the transmittance of the half-transparent layer 12 and the film thickness of the light-shielding layer 14 that satisfies the optical density being 3.0 in 2 layers: the half-transparent layer 12 and the light-shielding layer 14, becomes as shown in FIG. 5.

For example, when the transmittance of the half-transparent layer 12 is 6%, the film thickness of the light-shielding layer 14 that satisfies the above-described condition is 25 nm; similarly, when the transmittance of the half-transparent layer 12 is 20%, the film thickness of the light-shielding layer 14 is 33 nm; and when the transmittance of the half-transparent layer 12 is 30%, the film thickness of the light-shielding layer 14 is 35 nm.

Here, in the present invention, the optical density of a laminated body, in which three kinds of layers: a half-transparent layer 12, a middle layer 13, and a light-shielding layer 14 are laminated, with respect to the exposure light, is preferably 2.8 or more. On the other hand, the film thickness of the light-shielding layer 14 is preferably thinner for decreasing the EMF bias; for example, the above-described optical density being about 3.2 is sufficient.

Thus, in the present embodiment, the relation of a transmittance T of the half-transparent layer 12 and the film thickness "d" of the light-shielding layer 14 is preferably: in the range of 23 nm≤d≤27 nm when T=6%, in the range of 31 nm≤d≤35 nm when T=20%, and in the range of 33 nm≤d≤37 nm when T=30%.

<Evaluation of EMF Bias and Exposure Light Tolerance>

Next, the result of the EMF bias and exposure light tolerance (EL: Exposure Latitude) evaluation with regard to the phase shift mask of the present invention and a conventional binary type photo mask by means of simulations will be described.

(Conditions for Simulations)

The simulation was conducted under the following conditions. EM-Suite Version v6.00 (product name, manufactured by Panoramic Technology) was used as the simulation software; as for the three dimensional (also described as 3D) simulation condition, an FDTD method (also called as a finite difference time domain method, and a time domain finite difference method) by means of TEMPEST (EM-Suite option) of a three dimensional electromagnetic area simulation was used for the simulation mode; the grid size was determined to be 1 nm (in 4-times mask). As for the two dimensional (also described as 2D) simulation condition, Kirchhoff method was used for the simulation mode.

(Conditions for Lithography)

Figure 6:
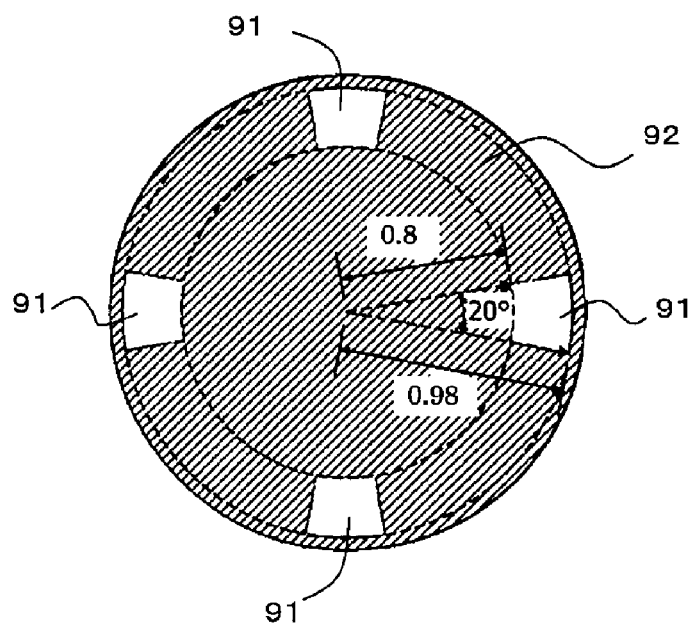
FIG. 6 is a schematic plan view of a quadrupole pupil filer (C-quad) used for a transfer property evaluation on a mask in the present invention.

In terms of conditions for the lithography in 2D and 3D simulations, the exposure light source was an ArF excimer laser whose exposure light wavelength was 193 nm and numerical aperture (NA) was 1.35. The exposure light was incident by oblique radiation using a pupil filter for lightings, and a quadrupole lighting using a quadrupole (C-quad) pupil filter shown in FIG. 6 was arranged. Four light transmitting portions 91 in the C-quad were fan-shaped with its opening angle on the XY axis being 20 degree from the pupil center; the light transmitting portions 91 were arranged at 0 degree and 90 degree with respect to the mask pattern, so that vertical and horizontal mask patterns may be transferred with high resolution; and if the radius of the pupil filter was regarded as 1, the external diameter distanced from the pupil center (outer σ) was set to be 0.98, and the internal diameter (inner a) was set to be 0.8. Other portions than the four light transmitting portions 91 is regarded as 92 (shaded area).

Incidentally, the numerical aperture (NA) 1.35 in the projection lens is merely an example typically used for a mask patter transfer in a fine semiconductor device, but it is of course not limited thereto in the present invention, and it is possible to use lens with other numerical aperture.

Also, the reason for using quadrupole lighting as lightings was because a quadrupole illumination allows vertical and horizontal patterns to be developed at the same time, and may be adopted for a general mask pattern transfer since its universality is high. However, a quadrupole lighting was merely used as a favorable example; the improved effect in the exposure light tolerance may be obtained similarly by using other modified lightings than a quadrupole lighting such as a zonal ray lighting and a dipole lighting (Evaluation of EMF Bias)

The evaluation result for EMF bias during formation of a 40 nm diameter isolated hole pattern in a resist on a wafer using the phase shift mask in Examples 1-1 to 1-3 and the conventional binary type photo mask in Comparative Example 1-1 will be described with reference to FIG. 7.

Figure 7:
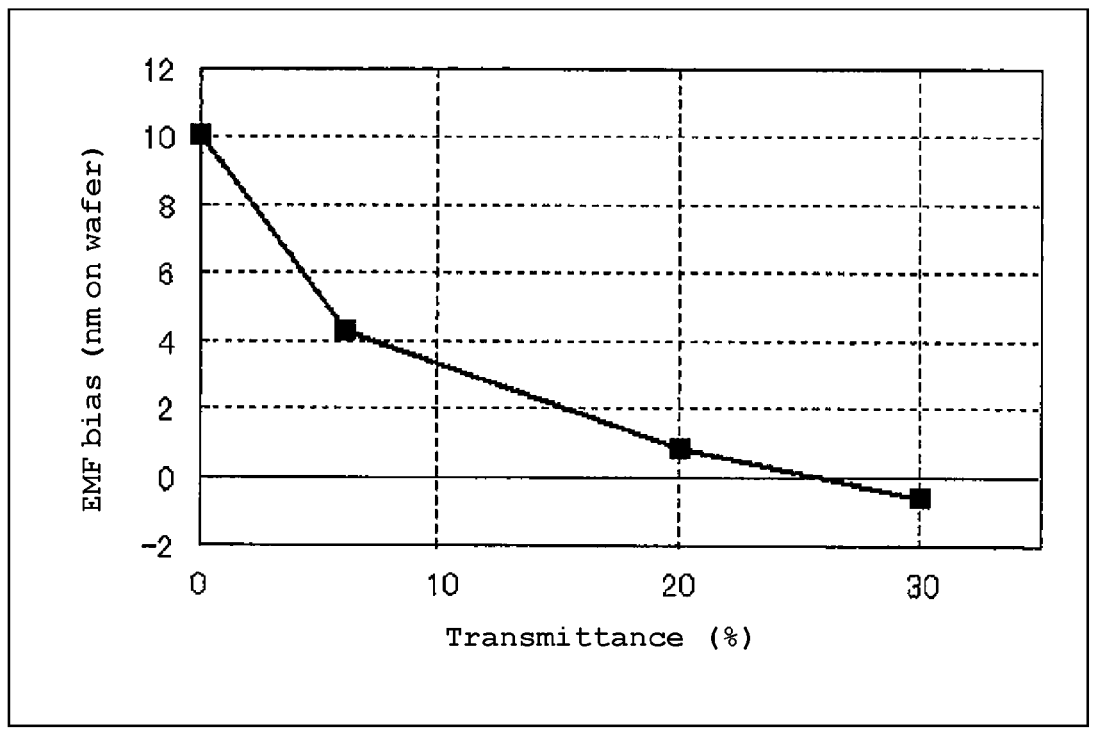
FIG. 7 is a graph showing a value of EMF bias in each mask constitution.

In FIG. 7, the dot on the transmittance 0% shows the value of EMF bias in Comparative Example 1-1; the dot on the transmittance 6% shows the value of EMF bias in Example 1-1; the dot on the transmittance 20% shows the value of EMF bias in Example 1-2; and the dot on the transmittance 30% shows the value of EMF bias in Example 1-3. Incidentally, the values of EMF bias in FIG. 7 are the size on a wafer. As shown in FIG. 7, when a 40 nm diameter isolated hole pattern was formed in a resist on a wafer, the conventional binary type photo mask in Comparative Example 1-1 required size of 10 nm EMF bias on a wafer, but the value of EMF bias was decreased in Examples 1-1 to 1-3; specifically, in Example 1-3, the value of EMF bias was decreased down to −0.6 nm.

Figure 8:
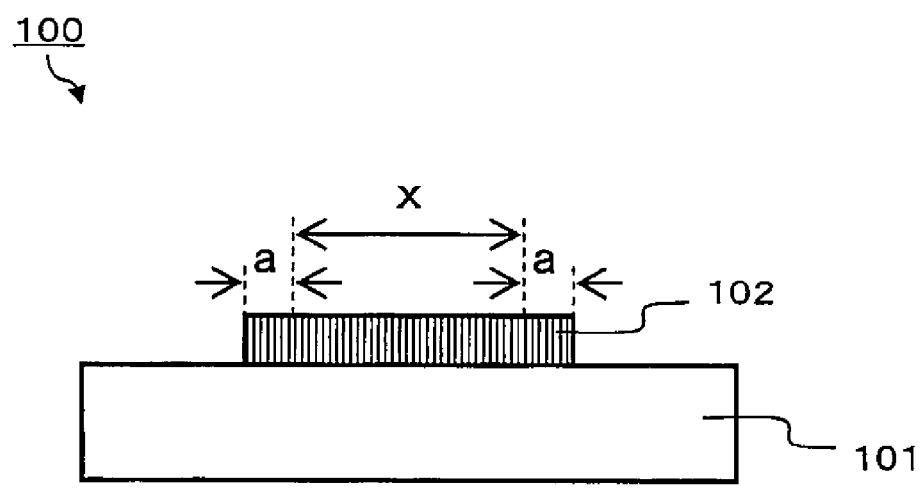
FIG. 8 is a cross-sectional view of a binary mask for explaining an EMF bias.

Here, the EMF bias used in the present invention will be described with reference to a cross-sectional view of a binary type photo mask shown in FIG. 8. FIG. 8 shows a binary mask 100 having a mask pattern comprised of a light-shielding pattern film 102 formed on a transparent substrate 101. Here, tetraploid reticule is usually used for a photo mask, so that the size of a line portion of a mask pattern (hereinafter referred to as a line CD (Critical Dimension)) is regarded as the value in which a correcting value: bias "d" (nm) is added to the value "x" being 4 times of the value "x" of the targeted line width size (hereinafter referred as a targeted CD) on a wafer (nm) (x=the targeted CD×4).

In FIG. 8, a bias "d" is represented as:

$$\text{bias}(d) = 2 \times a.$$

In the above formula, when the value of the bias "d" is +, the value means the direction of widening the line CD; when the value of "d" is, the value means the direction of narrowing the line CD. However, in the present invention, + is not particularly described when + is the case.

The EMF bias with regard to the effect of the electromagnetic field (EMF) affects greatly on the important size (CD) accuracy of a transferring pattern line width to a resist on a wafer. Accordingly, a photo mask pattern is required to be corrected to inhibit the effect from the electromagnetic field (EMF) by conducting the simulation for the electromagnetic field effect before producing a photo mask. The calculation for this correction of a mask pattern will be complicated if the EMF bias is larger. Also, the corrected mask pattern will be complicated if the EMF bias is larger, and loads will be added to a photo mask production. For example, the problems caused are such that the bias value increases, and a pattern cannot be corrected due to a relation with an adjacent pattern. If the value of EMF bias is closer to 0, the photo mask production becomes easier with less correction required, and it leads to the improvement of a mask production yield.

(Evaluation of Exposure Light Tolerance)

Next, the evaluation result for the exposure light tolerance will be described with reference to Table 1.

Here, the exposure light tolerance (EL: %) is in a range of an exposure light energy to the extent that the size of a resist pattern film on a wafer is within the tolerable limit, and is the value that shows tolerance to the change in exposure light amount (dosage amount) in a photo lithography. In other words, it is in a range of an exposure light energy such that the change in line width size of a resist pattern is within the predetermined tolerable range. If the exposure light tolerance is large, it will lead the improvement of the yield in a photo lithography step of a semiconductor element production.

In Table 1, evaluated with comparison was the exposure light tolerance (EL) in which the targeted CD in each pattern pitch (nm) on a wafer is within ±10%, in the phase shift mask in Examples 1-1 to 1-3 and the conventional binary type photo mask in Comparative Example 1-1.

Evaluated mask pattern was a line and space pattern whose through pitch (full pitch) when transferred on a wafer was in a range of 80 nm to 300 nm; the targeted line CD was 10 nm on a wafer.

TABLE 1

| Pitch (nm) | Comparative Example 1-1 (BIM) | Example 1-1 (6% PSM) | Example 1-2 (20% PSM) | Example 1-3 (30% PSM) |
|---|---|---|---|---|
| 80 | 0.7 | 1.3 | 1.7 | 1.8 |
| 160 | 0.4 | 0.9 | 1.1 | 1.2 |
| 300 | 0.2 | 0.6 | 0.7 | 0.8 |

As shown in Table 1, in the phase shift masks with regard to the present invention in Examples 1-1 to 1-3, the exposure light tolerance was increased in any ranges compared to the conventional binary type photo mask in Comparative Example 1-1; in particular, in the phase shift mask in Example 1-3, the great values were obtained such that the exposure light tolerance 1.8% in the pattern pitch 80 nm, the exposure light tolerance 1.2% in the pattern pitch 160 nm, and the exposure light tolerance 0.8% in the pattern pitch 300 nm.

Example 2-1

Used were an optically polished 6 inch square and 0.25 inch thick synthesized quartz substrate as a transparent substrate 11, a molybdenum silicide oxide film (MoSiO) as a half-transparent layer 12, a 2 nm film thick CrN film as a middle layer 13, and a silicon (Si) film as a light-shielding layer 14, so as to produce a mask blank 20.

Here, the film thickness of the half-transparent layer 12 was adjusted so that the transmittance with respect to the exposure light became 6%; the film thickness of the light-shielding layer 14 was adjusted so that the optical density of the laminated body, in which three kinds of layers: the half-transparent layer 12, the middle layer 13, and the light-shielding layer 14, were laminated, with respect to the exposure light became 3.0.

The optical density was measured by MCPD3000 manufactured by OTSUKA ELECTRONICS Co., LTD; an optical constant was obtained by the measurement with an ellipsometer (manufactured by J.A. Woollam Co.). Also, the film thickness was obtained by a step measurement using an AFM apparatus (manufactured by SII Nanotechnology Inc.).

Example 2-2

A mask blank 20 was produced in the same manner as in Example 2-1, except that a 4 nm film thick CrN film was used as the middle layer 13, and the film thickness of the half-transparent layer 12 and the light-shielding layer 14 were adjusted.

Comparative Example 2-1

A mask blank 20 was produced in the same manner as in Example 2-1, except that a 6 nm film thick CrN film was used as the middle layer 13, and the film thickness of the half-transparent layer 12 and the light-shielding layer 14 were adjusted.

Comparative Example 2-2

A mask blank 20 was produced in the same manner as in Example 2-1, except that a 8 nm film thick CrN film was used as the middle layer 13, and the film thickness of the half-transparent layer 12 and the light-shielding layer 14 were adjusted.

Comparative Example 2-3

A mask blank 20 was produced in the same manner as in Example 2-1, except that a 10 nm film thick CrN film was used as the middle layer 13, and the film thickness of the half-transparent layer 12 and the light-shielding layer 14 were adjusted.

<Relation Between Film Thickness of Middle Layer and Whole Film Thickness of Middle Layer and Light-Shielding Layer>

The relation between the film thickness of the middle layer 13 and the whole film thickness of the middle layer 13 and the light-shielding layer 14, in the Examples 2-1 to 2-2 and the Comparative Examples 2-1 to 2-3 will be described. Table 2 shows the film thickness of the middle layer 13 (CrN film), the light-shielding layer 14 (silicon film (Si)), the whole film thickness of the middle layer 13 and the light-shielding layer 14, and the optical density (OD value) with respect to the exposure light of the laminated body. Incidentally, the refractive index "n" and the extinction coefficient "k" of the CrN film used for the middle layer 13 were 1.5 and 1.8 respectively, and the refractive index "n" and the extinction coefficient "k" of the silicon (Si) film used for the light-shielding layer 14 were 0.9 and 2.7 respectively.

TABLE 2

|  | Example 2-1 | Example 2-2 | Comparative Example 2-1 | Comparative Example 2-2 | Comparative Example 2-3 |
|---|---|---|---|---|---|
| Film thickness of CrN film | 2 | 4 | 6 | 8 | 10 |
| Film thickness of silicon film | 25 | 23 | 22 | 21 | 19 |
| Whole film thickness | 27 | 27 | 28 | 29 | 29 |
| Optical density (OD value) | 3.03 | 2.99 | 3.02 | 3.05 | 3.01 |

As shown in Table 2, it was found out that the whole thickness of the middle layer 13 and the light-shielding layer 14 became thicker when the film thickness of the middle layer 13 was 5 nm or more, compared to when the film thickness of the middle layer 13 was 5 nm or less. Accordingly, it was suggested that the increase in the value of EMF bias in a phase shift mask may be avoided when the film thickness of the middle layer 13 is 5 nm or less.

Example 3-1

A mask blank 20 was produced in the same manner as in Example 2-1, except that a 2 nm film thick CrON film was used as the middle layer 13, and the film thickness of the half-transparent layer 12 and the light-shielding layer 14 were adjusted.

Example 3-2

A mask blank 20 was produced in the same manner as in Example 2-1, except that a 4 nm film thick CrON film was used as the middle layer 13, and the film thickness of the half-transparent layer 12 and the light-shielding layer 14 were adjusted.

Comparative Example 3-1

A mask blank 20 was produced in the same manner as in Example 2-1, except that a 6 nm film thick CrON film was used as the middle layer 13, and the film thickness of the half-transparent layer 12 and the light-shielding layer 14 were adjusted.

Comparative Example 3-2

A mask blank 20 was produced in the same manner as in Example 2-1, except that a 8 nm film thick CrON film was used as the middle layer 13, and the film thickness of the half-transparent layer 12 and the light-shielding layer 14 were adjusted.

Comparative Example 3-3

A mask blank 20 was produced in the same manner as in Example 2-1, except that a 10 nm film thick CrON film was used as the middle layer 13, and the film thickness of the half-transparent layer 12 and the light-shielding layer 14 were adjusted.

<Relation Between Film Thickness of Middle Layer and Whole Film Thickness of Middle Layer and Light-Shielding Layer>

The relation between the film thickness of the middle layer 13 and the whole film thickness of the middle layer 13 and the light-shielding layer 14, in the Examples 3-1 to 3-2 and the Comparative Examples 3-1 to 3-3 will be described. Table 3 shows the film thickness of the middle layer 13 (CrON film), the light-shielding layer 14 (silicon film (Si)), the whole film thickness of the middle layer 13 and the light-shielding layer 14, and the optical density (OD value) with respect to the exposure light of the laminated body. Incidentally, the refractive index "n" and the extinction coefficient "k" of the CrON film used for the middle layer 13 were 2.4 and 1.4 respectively, and the refractive index "n" and the extinction coefficient "k" of the silicon (Si) film used for the light-shielding layer 14 were 0.9 and 2.7 respectively.

TABLE 3

|  | Example 3-1 | Example 3-2 | Comparative Example 3-1 | Comparative Example 3-2 | Comparative Example 3-3 |
|---|---|---|---|---|---|
| Film thickness of CrON film | 2 | 4 | 6 | 8 | 10 |
| Film thickness of silicon film | 25 | 24 | 23 | 22 | 21 |
| Whole film thickness | 27 | 28 | 29 | 30 | 31 |
| Optical density (OD value) | 3 | 3.01 | 3.02 | 3.03 | 3.04 |

As shown in Table 3, it was found out that the whole thickness of the middle layer 13 and the light-shielding layer 14 became thicker when the film thickness of the middle layer 13 was 5 nm or more, compared to when the film thickness of the middle layer 13 was 5 nm or less. Accordingly, it was suggested that the increase in the value of EMF bias in a phase shift mask may be avoided when the film thickness of the middle layer 13 was 5 nm or less.

Also, in comparison of Table 2 with Table 3, when the film thickness of the middle layer 13 was 4 nm or more, the film thickness of the light-shielding layer 14 as well as the whole thickness of the middle layer 13 and the light-shielding layer 14 became thinner when a CrN film was used for the middle layer 13 compared to when a CrON film was used for the middle layer 13. The reason therefor is considered to be because the extinction coefficient "k" is higher and the transmittance is lower in a CrN film than in CrON film. Also, the reason therefor is considered to be because a CrN film does not include oxygen (O) on the contrary that a CrON film includes oxygen (O).

The mask blank, the phase shift mask, and the producing method thereof in the present invention have been described above, but the present invention is not limited to the embodiments. The embodiments are exemplifications, and any is included in the technical scope of the present invention if it has the substantially same constitution with the technical ideas described in claims of the present invention and the same operations and effects thereto.

REFERENCE SIGNS LIST 10, 20 mask blank
11 transparent substrate
12 half-transparent layer
13 middle layer
14 light-shielding layer
21 hard mask layer
22, 23, 24, 25 hard mask pattern film
30, 40 phase shift mask
32, 32a, 32b, 32c, 32d half-transparent pattern film
33, 33a, 33b, 33c middle pattern film
34, 34a, 34b, 34c light-shielding pattern film
42, 42a, 42b, 42c, 42d half-transparent pattern film
43, 43a, 43b, 43c middle pattern film
44, 44a, 44b, 44c light-shielding pattern film
51, 53, 54, 56 resist pattern film
52, 55 resist layer
63, 73 middle pattern film
64, 74 light-shielding pattern film
91 light transmitting portion
92 light-shielding portion
100 binary mask
101 transparent substrate
102 light-shielding pattern film

The invention claimed is:

1. A mask blank to be used for producing a half tone type phase shift mask which applies an ArF excimer laser exposure light, comprising:
   a transparent substrate,
   a half-transparent layer for controlling a phase and a transmittance of the exposure light, formed on the transparent substrate,
   a middle layer formed on the half-transparent layer, and
   a light-shielding layer formed on the middle layer,
   wherein the light-shielding layer is comprised of a single metal material not including a transition metal,
   a film thickness of the light-shielding layer is 40 nm or less, and
   an optical density of a laminated body, in which three kinds of layers: the half-transparent layer, the middle layer, and the light-shielding layer are laminated, with respect to the exposure light is a value to the extent that the laminated body functions as a light-shielding region or more.

2. The mask blank according to claim 1, wherein the laminated body, in which three kinds of layers: the half-transparent layer, the middle layer, and the light-shielding layer are laminated, is adjusted so as to have an optical density with respect to the exposure light being 2.8 or more.

3. The mask blank according to claim 1, wherein a relation between a transmittance T with respect to the exposure light of the half-transparent layer and a film thickness "d" of the light-shielding layer is:
   in the range of 23 nm≤d≤27 nm when T=6%,
   in the range of 31 nm≤d≤35 nm when T=20%,
   in the range of 33 nm≤d≤37 nm when T=30%.

4. The mask blank according to claim 1, wherein the light-shielding layer is comprised of the single metal material with a refractive index "n" being 1.0 or less and an extinction coefficient "k" being 2.0 or more.

5. The mask blank according to claim 1, wherein the single metal material is silicone.

6. The mask blank according to claim 1, wherein the half-transparent layer is comprised of $Si_xO_{1-x-y}N_y$ ("x" and "y" satisfy 0<x<1, 0<y<1, and 0<x+y≤1).

7. The mask blank according to claim 1, wherein the middle layer is comprised of a material with resistance to a dry etching using fluorine-based gas.

8. The mask blank according to claim 1, wherein the middle layer is comprised of a chrome-based material containing chrome (Cr), and a film thickness of the middle layer is in the range of 2 nm to 5 nm.

9. The mask blank according to claim 1, wherein a hard mask layer comprised of a material with resistance to a dry etching using fluorine-based gas is provided on the light-shielding layer.

10. A half tone type phase shift mask which applies an ArF excimer laser exposure light, comprising:
a transparent substrate,
a half-transparent pattern film for controlling a phase and a transmittance of the exposure light, formed on the transparent substrate,
a middle pattern film formed on the half-transparent pattern film, and
a light-shielding pattern film formed on the middle pattern film,
wherein the light-shielding pattern film is comprised of a single metal material not including a transition metal,
a film thickness of the light-shielding pattern film is 40 nm or less, and
an optical density of a laminated body, in which three kinds of films: the half-transparent pattern film, the middle pattern film, and the light-shielding pattern film are laminated, with respect to the exposure light is a value to the extent that the laminated body functions as a light-shielding region or more.

11. The phase shift mask according to claim 10, wherein the laminated body, in which three kinds of films: the half-transparent pattern film, the middle pattern film, and the light-shielding pattern film are laminated, is adjusted so as to have an optical density with respect to the exposure light being 2.8 or more.

12. The phase shift mask according to claim 10, wherein a relation between a transmittance T with respect to the exposure light of the half-transparent pattern film and a film thickness "d" of the light-shielding pattern film is:
in the range of 23 nm≤d≤27 nm when T=6%,
in the range of 31 nm≤d≤35 nm when T=20%,
in the range of 33 nm≤d≤37 nm when T=30%.

13. The phase shift mask according to claim 10, wherein the light-shielding pattern film is comprised of the single metal material with a reflective index "n" being 1.0 or less and an extinction coefficient "k" being 2.0 or more.

14. The phase shift mask according to claim 10, wherein the single metal material is silicone.

15. The phase shift mask according to claim 10, wherein the half-transparent pattern film is comprised of $Si_xO_{1-x-y}N_y$ ("x" and "y" satisfy 0<x<1, 0<y<1, and 0<x+y≤1).

16. The phase shift mask according to claim 10, wherein the middle pattern film is comprised of a material with resistance to a dry etching using fluorine-based gas.

17. The phase shift mask according to claim 10, wherein the middle pattern film is comprised of a chrome-based material containing chrome (Cr), and a film thickness of the middle pattern film is in the range of 2 nm to 5 nm.

18. A producing method for a phase shift mask, the method comprising steps of:
preparing a mask blank with a hard mask layer comprising a transparent substrate, a half-transparent layer for controlling a phase and a transmittance of the exposure light, formed on the transparent substrate, a middle layer formed on the half-transparent layer, and a light-shielding layer formed on the middle layer, in which a hard mask layer is formed on the light-shielding layer of the mask blank, the light-shielding layer is comprised of a single metal material not including a transition metal;
forming a first resist pattern film on the hard mask layer;
forming a first form of a hard mask pattern film by etching the hard mask layer exposed from the first resist pattern film;
forming a first form of a light-shielding pattern film by etching the light-shielding layer exposed from the first form of a hard mask pattern film by using the middle layer as an etch stopping layer;
removing the first resist pattern film;
forming a second resist pattern film that covers a desired region of the first form of a hard mask pattern film and a desired region of the middle layer exposed from the first form of a light-shielding pattern film;
forming a second form of a hard mask pattern film and a first form of a middle pattern film by etching the first form of a hard mask pattern film exposed from the second resist pattern film and the middle layer exposed from the second resist pattern film and the first form of a light-shielding pattern film;
removing the second resist pattern film;
forming a second form of a light-shielding pattern film and a half-transparent pattern film by etching the first form of a light-shielding pattern film exposed from the second form of a hard mask pattern film and the half-transparent layer exposed from the first form of a middle pattern film; and
forming a second form of a middle pattern film by etching the second form of a hard mask pattern film and the first form of a middle pattern film exposed from the second form of a light-shielding pattern film, while removing the second form of a hard mask pattern film;
in this order.

19. A producing method for a phase shift mask, the method comprising steps of:
preparing a mask blank with a hard mask layer comprising a transparent substrate, a half-transparent layer for controlling a phase and a transmittance of the exposure light, formed on the transparent substrate, a middle layer formed on the half-transparent layer, and a light-shielding layer formed on the middle layer, in which a hard mask layer is formed on the light-shielding layer of the mask blank, the light-shielding layer is comprised of a single metal material not including a transition metal;
forming a first resist pattern film on the hard mask layer;
forming a first form of a hard mask pattern film by etching the hard mask layer exposed from the first resist pattern film;
forming a first form of a light-shielding pattern film by etching the light-shielding layer exposed from the first form of a hard mask pattern film by using the middle layer as an etch stopping layer;
forming a first form of a middle pattern film by etching the middle layer exposed from the first form of a light-shielding pattern film;
removing the first resist pattern film;
forming a second resist pattern film that covers a desired region of the first form of a hard mask pattern film;
forming a second form of a hard mask pattern film by etching the first form of a hard mask pattern film exposed from the second resist pattern film;
removing the second resist pattern film;
forming a second form of a light-shielding pattern film and a half-transparent pattern film by etching the first form of a light-shielding pattern film exposed from the second form of a hard mask pattern film and the half-transparent layer exposed from the first form of a middle pattern film; and forming a second form of a middle pattern film by etching the second form of a hard mask pattern film and the first form of a middle pattern film exposed from the second form of a light-shielding pattern film, while removing the second form of a hard mask pattern film;

in this order.

* * * * *